(12) United States Patent
Sitti et al.

(10) Patent No.: US 8,524,092 B2
(45) Date of Patent: Sep. 3, 2013

(54) DRY ADHESIVES AND METHODS FOR MAKING DRY ADHESIVES

(75) Inventors: Metin Sitti, Pittsburgh, PA (US); Seok Kim, Urbana, IL (US)

(73) Assignee: Carnegie Mellon University, Pittsburgh, PA (US)

( * ) Notice: Subject to any disclaimer, the term of this patent is extended or adjusted under 35 U.S.C. 154(b) by 477 days.

(21) Appl. No.: 12/448,243

(22) PCT Filed: Dec. 14, 2007

(86) PCT No.: PCT/US2007/025684
§ 371 (c)(1),
(2), (4) Date: Jun. 12, 2009

(87) PCT Pub. No.: WO2008/076391
PCT Pub. Date: Jun. 26, 2008

(65) Prior Publication Data
US 2010/0136281 A1    Jun. 3, 2010

Related U.S. Application Data

(60) Provisional application No. 60/874,787, filed on Dec. 14, 2006.

(51) Int. Cl.
*C25F 3/00* (2006.01)
(52) U.S. Cl.
USPC ............. 216/11; 216/39; 216/41; 216/43
(58) Field of Classification Search
USPC .......................... 216/11, 39, 41, 43
See application file for complete search history.

(56) References Cited

U.S. PATENT DOCUMENTS

| | | | |
|---|---|---|---|
| 5,703,979 A * | 12/1997 | Filas et al. | 385/43 |
| 6,183,329 B1 * | 2/2001 | Cathey et al. | 445/24 |
| 6,439,890 B1 * | 8/2002 | Karmaker et al. | 433/220 |
| 6,722,026 B1 | 4/2004 | Lent | |
| 6,737,160 B1 | 5/2004 | Full et al. | |
| 6,872,439 B2 | 3/2005 | Fearing et al. | |
| 6,913,075 B1 | 7/2005 | Knowles et al. | |
| 7,011,723 B2 | 3/2006 | Full et al. | |
| 7,029,288 B2 * | 4/2006 | Li | 439/66 |
| 7,056,409 B2 | 6/2006 | Dubrow | |
| 7,074,294 B2 | 7/2006 | Dubrow | |

(Continued)

FOREIGN PATENT DOCUMENTS

WO   WO 2005/026042 A   3/2005
WO   WO 2005/087033 A   9/2005

OTHER PUBLICATIONS

Ayon, A. A., et al, "Characterization of a Time Multiplexed Inductively Coupled Plasma Etcher", Journal of the Electrochemical Society, 1999, 146 (1) 339-349.

(Continued)

*Primary Examiner* — Binh X Tran
(74) *Attorney, Agent, or Firm* — David G. Oberdick; Peter J. Borghetti

(57) ABSTRACT

A dry adhesive and a method of forming a dry adhesive. The method includes forming an opening through an etch layer and to a barrier layer, expanding the opening in the etch layer at the barrier layer, filling the opening with a material, removing the barrier layer from the material in the opening, and removing the etch layer from the material in the opening.

38 Claims, 10 Drawing Sheets

(56) References Cited

U.S. PATENT DOCUMENTS

| | | | |
|---|---|---|---|
| 7,132,161 | B2 | 11/2006 | Knowles et al. |
| 7,144,624 | B2 | 12/2006 | Knowles et al. |
| 7,153,615 | B2 * | 12/2006 | Bristol et al. ............ 430/5 |
| 7,175,723 | B2 | 2/2007 | Jones et al. |
| 7,229,685 | B2 | 6/2007 | Full et al. |
| 7,279,916 | B2 | 10/2007 | Suhir |
| 7,632,417 | B2 | 12/2009 | Suh et al. |
| 2003/0124312 | A1 | 7/2003 | Autumn |
| 2003/0208888 | A1 | 11/2003 | Fearing |
| 2003/0209642 | A1 | 11/2003 | Fontana et al. |
| 2004/0076822 | A1 | 4/2004 | Jagota et al. |
| 2005/0038498 | A1 | 2/2005 | Dubrow et al. |
| 2005/0072509 | A1 | 4/2005 | Full et al. |
| 2005/0119640 | A1 | 6/2005 | Sverduk et al. |
| 2005/0148984 | A1 | 7/2005 | Lindsay et al. |
| 2005/0151385 | A1 | 7/2005 | Autumn et al. |
| 2005/0181170 | A1 | 8/2005 | Fearing et al. |
| 2005/0181629 | A1 | 8/2005 | Jagota et al. |
| 2005/0221072 | A1 | 10/2005 | Dubrow et al. |
| 2005/0224975 | A1 | 10/2005 | Basavanhally et al. |
| 2005/0271869 | A1 | 12/2005 | Jackson |
| 2005/0271870 | A1 | 12/2005 | Jackson |
| 2006/0005362 | A1 | 1/2006 | Artz et al. |
| 2006/0078725 | A1 | 4/2006 | Fearing et al. |
| 2006/0097252 | A1 | 5/2006 | Basavanhally et al. |
| 2006/0141814 | A1 * | 6/2006 | Li .......................... 439/66 |
| 2006/0165952 | A1 | 7/2006 | Dubrow |
| 2006/0202355 | A1 | 9/2006 | Majidi et al. |
| 2006/0204738 | A1 | 9/2006 | Dubrow et al. |
| 2006/0213599 | A1 | 9/2006 | Knowles et al. |
| 2008/0073323 | A1 | 3/2008 | Full et al. |

OTHER PUBLICATIONS

Form PCT/ISA/220, PCT Notification of Transmittal of the International Search Report and the Written Opinion for Int'l Appln No. PCT/US2007/025684, Date Mailed Aug. 12, 2008.

Form PCT/ISA/210, PCT International Search Report for International Application No. PCT/US2007/025684, Date Mailed Aug. 12, 2008.

Form PCT/ISA/237, PCT Written Opinion of the International Searching Authority for International Application No. PCT/US2007/025684, Date Mailed Aug. 12, 2008.

Form PCT/IPEA/416, PCT Notification of Transmittal of the Int'l Preliminary Report on Patentability, for Int'l Appln No. PCT/US2007/025684, Date Mailed Apr. 23, 2009.

Form PCT/IPEA/409, PCT International Preliminary Report on Patentability, for Int'l Appln No. PCT/US2007/025684, Dated Mailed Apr. 23, 2009.

Aksak, Burak, et al, "Adhesion of Biologically Inspired Vertical and Angled Polymer Microfiber Arrays", Langmuir 2007, 3322-3332.

Arzt, Eduard et al, "From micro to nano contacts in biological attachment devices", PNAS, Sep. 16, 2003, vol. 100, No. 19, 10603-10606.

Autumn, Kellar, et al, "Adhesive force of a single gecko foot-hair", Nature, Jun. 8, 2000, vol. 405, 681-685.

Autumn, Kellar, et al, "Evidence for van der Weals adhesion in gecko setae", PNAS, Sep. 17, 2002, vol. 99, No. 19, 12252-12256.

Autumn, K., et al, "Effective elastic modulus of isolated gecko setal arrays", The Journal of Experimental Biology 209, 2006, 3558-3568.

Varenberg, M., et al, "Close-up of mushroom-shaped fibrillar adhesive microstructure: contact element behaviour", J. R. Soc. Interface, 2008, 5, 785-789. Downloaded from www.rsif.royalsocietypublishing.org on Jul. 15, 2009. First published online Oct. 16, 2007.

Campolo, Domenico, et al, "Efficient Charge Recovery Method for Driving Piezoelectric Actuators with Quasi-Square Waves", IEEE Trans. on Ultrasonics, Ferroelectrics, and Frequency Control, vol. 50, No. Jan. 1, 2003, 1-10.

Crosby, Alfred J., et al, "Controlling Polymer Adhesion with "Pancakes"", Langmuir 2005, 21, 11738-11743, published on web Nov. 3, 2005.

Del Campo, Aranzazu, et al, "Design Parameters and Current Fabrication Approaches for Developing Bioinspired Dry Adhesives", Molecular Bioscience, 2007, 7, 118-127.

Gao, Huajiari, et al, "Shape insensitive optimal adhesiion of nanoscale fibrillar structures", PNAS, May 25, 2004, vol. 101, No. 21, 7851-7856.

Geim, A.K., et al, "Microfabricated adhesive mimicking gecko foothair", Nature Materials, vol. 2, Jul. 2003, 461-463.

Glassmaker, N. J., et al, "Design of biomimetic fibrillar interfaces: 1. Making contact", Journal of the Royal Society Interface, 2004 1, 23-33, Published online Jul. 7, 2004.

Glassmaker, Nicholas J., et al, "Biologically inspired crack trapping for enhanced adhesion", PNAS, Jun. 26, 2007, vol. 104, No. 26, 10786-10791.

Greiner, Christian, et al, "Adhesion of Bioinspired Micropatterned Surfaces: Effects of Pillar Radius, Aspect Ratio, and Preload", Langmuir 2007, 23, 3495-3502, Published on web Feb. 2, 2007.

Huber, Gerrit, et al, "Resolving the nanoscale adhesion of individual gecko spatulae by atomic force microscopy", Biology Letters, 2005, 1-4. Downloaded from www.rsif.royalsocietypublishing.org on Jul. 15, 2009.

Huber, Gerrit, et al, "Evidence for capillarity contributions to gecko adhesion from single spatula nanomechanical measurements", PNAS, Nov. 8, 2005, vol. 102, No. 45, 16293-16296.

Hui, C.-Y., et al, "Design of biomimetic fibrillar interfaces: 2. Mechanics of enhanced adhesion", J. Roy Soc. Interface, 2004, 35-48. Downloaded from www.rsif.royalsocietypublishing.org on Jul. 15, 2009, Published online Jul. 7, 2004.

Jeong, Hoon Eui, et al, "Stretched Polymer Nanohairs by Nanodrawing" Nano Letters, 2006, vol. 6, No. 7, 1508-1513.

Kim, Seok, et al, "Biologically inspired polymer microfibers with spatulate tips as repeatable fibrillar adhesives", Applied Physics Letters 89, 2006, 261911-1-261911-3.

Kim, Seok, et al, "Effect of backing layer thickness on adhesion of single-level elastomer fiber arrays", Applied Physics Letters 91, 2007, 161905-1-161905-3.

Mcnie, M.E., et al, "Advanced MicromeChanical Prototyping in Polysilicon and SOI", Proc. of IEEE Intl SOI Conference, 60, 1997, Aug. 1-Aug. 4. Downloaded from www.ieeexplore.ieee.org on Jul. 15, 2009.

Varenberg, M., et al, "Shearing of fibrillar adhesive microstructure: friction and shear-related changes in pull-off force", J. R. Soc. Interface, 2007, 4, 721-725. Downloaded from www.rsif.royalsocietypublishing.org on Jul. 15, 2009, Published online Feb. 27, 2007.

Persson, B. N. J., "On the mechanism of adhesion in biological systems", Journal of Chemical Physics, vol. 118, No. 16, 2003, 7614-7621, Apr. 22, 2003.

Sitti, Metin, et al, "Synthetic gecko foot-hair micro/nano-structures as dry adhesives" J. Adhesion Sci. Technol., 2003, vol. 17, No. 8, pp. 1055-1073.

Tang, Tian, et al, "Can a fibrillar interface be stronger and tougher than a non-fibrillar one?", Journal of the Royal Society Interface, 2005 2, 505-516. Downloaded from www.rsif.royalsocietypublishing.org on Jul. 15, 2009, Published online Aug. 12, 2005.

Varenberg, M., et al, "Effect of real contact geometry on adhesion", Applied Physics Letters 89, 2006, 121905-1-121905-3.

Zhao, Yang, et al, "Interfacial energy and strength of multiwalled-carbon-nanotube-based dry adhesive", J. Vac. Sci. Technol. B, vol. 24, No. 1, Jan/Feb 2006, 331-335. Downloaded from www.rsif.royalsocietypublishing.org on Jul. 15, 2009.

Tian, Yu, et al, "Adhesion and friction in gecko toe attachment and detachment", PNAS, Dec. 19, 2006, vol. 103, No. 51, 19320-19325.

Chung, Jun Young, et al, "Roles of discontinuities in bio-inspired adhesive pads", Journal of the Royal Society Interface, 2005, 2, 55-61, Published online Feb. 8, 2005.

Del Campo, Aranzaztg.et al, "Contact Shape Controls Adhesion of Bioinspired Fibrillar Surfaces", Langmuir 2007, 23, 10235-10243, Published on web Aug. 28, 2007.

Spolenak, Ralph, et al, "Effects of contact shape on the scaling of biological attachments", Proc. R. Soc. A, 2005, 461, 305-319. Downloaded from www.rsif.royalsocietypublishing.org on Jul. 15, 2009, Published online Nov. 2, 2004.

Hansen, W.R., et al, "Evidence for self-cleaning in gecko setae", PNAS, Jan. 11, 2005, vol. 102, No. 2, 385-389.

Jagota, Anand, et al, "Mechanics of Adhesion Through a Fibrillar Microsturcture", Integr. Comp. Biol., 2002, 42: 1140-1145.

Jin, Meihua, et al, "Superhydrophobic Aligned Polystyrene Nanotube Films with High Adhesive Force", Advanced Materials, 2005, 17, 1977-1981, Published online Jun. 30, 2005.

Kim, Seok, et al, "Enhanced friction of elastomer microfiber adhesives with spatulate tips", Applied Physics Letters, 2007, 91, 221913-1-221913-3.

Majidi, Carmel, et al, "Clumping and packing of hair arrays manufactured by nanocasting", Proceedings of IMECE '04, 2004, ASME Int'l, Mechanical Engineering Congress and Exposition, Anaheim, CA USA, Nov. 13-19, 2004, 1-6.

Majidi, Carmel S., et al, "Attachment of fiber array adhesive through side contact", Journal of Applied Physics, 2005, 98, 103521-1-103521-5, Published online Nov. 28, 2005.

Majidi, C., et al, "High Friction from a Stiff Polymer Using Microfiber Arrays", PRL 2006, 97.076103-1-076103-4, Published Aug. 18, 2006.

Murphy, Michael P., et al, "Adhesion and anisotropic friction enhancements of angled heterogeneous micro-fiber arrays with spherical and spatula tips", J. Adhesion Sci. Technol., 2007, vol. 21, No. 12-13, 1281-1296.

Peressadko, Andrei, et al, "When less is more: Experimental evidence for tenacity enhancement by division of contact area", The Journal of Adhesion, 2004, 80, 247-261.

Santos, Daniel, et al, "Directional adhesion for climbing: theoretical and practical considerations", J. Adhesion Sci. Technol., 2007, vol. 21, No. 12-13, 1317-1341.

Jianhua Shan et al., "Fabrication and Adhesive Force Analysis of Biomimetic Gecko Foot-Hair Array" Nano/Micro Engineered and Molecular Systems, 2006. NEMS '06. 1ST IEEE International Conference on, IEEE, PI, Jan. 1, 2006, pp. 1546-1549, XP031064133 ISBN: 978-1-4244-0139-0.

Sitti, M. "High aspect ratio polymer micro/nano-structure manufacturing using nanoembossing, nanomolding and directed self-assembly", Advanced Intelligent Mechatronics, 2003, AIM 2003, Proceedings, 2003 IEEE/ASME International Conference on Jul. 20-Jul. 24, 2003, Piscataway, NJ, USA, IEEE vol. 2, Jul. 20, 2003, pp. 886-890, XP010654595, ISBN: 978-0-7803-7759-2.

Pfaff, H. : "Synthesis and adhesion of biomimetic contact elements", Max Planck Institut Fur Metallforschung, [Online] Feb. 2006, XP002490286.

Fearing, R., "Gecko Adhesion Bibliography" [Online] Jan. 2008, pp. 1-8, XP002490287.

Gorb, S., et al., "Biomimetic mushroom-shaped fibrillar adhesive microstructure" Journal of the Royal Society Interface [Online] Oct. 17, 2006, pp. 271-275, XP002490285, Retrieved from the Internet: URL: http//www.pubmedcentral.nih.gov/picre nder.fcgi?artid=2359835&blobtype-pdf>[retrieved on Jul. 26, 2008].

Northen, Michael T., et al., "A batch fabricated biomimetic dry adhesive" Nanotechnology, IOP, Bristol, GB vol. 16, No. 8, Aug. 1, 2005, pp. 1159-1166, XP020091191 ISSN: 0957-4484, Published May 17, 2005.

Campolo, D. et al., "Fabrication of Gecko foot-hair like nano structures and adhesion to random rough surfaces" Nanotechnology, 2003, IEEE-NANO 2003, 2003 Third IEEE Conference on Aug. 12-14, 2003, Piscataway, NJ, USA, IEEE, vol. 2, Aug. 12, 2003, pp. 856-859, XP010657743 ISBN: 978-0/7803-7976-3.

* cited by examiner

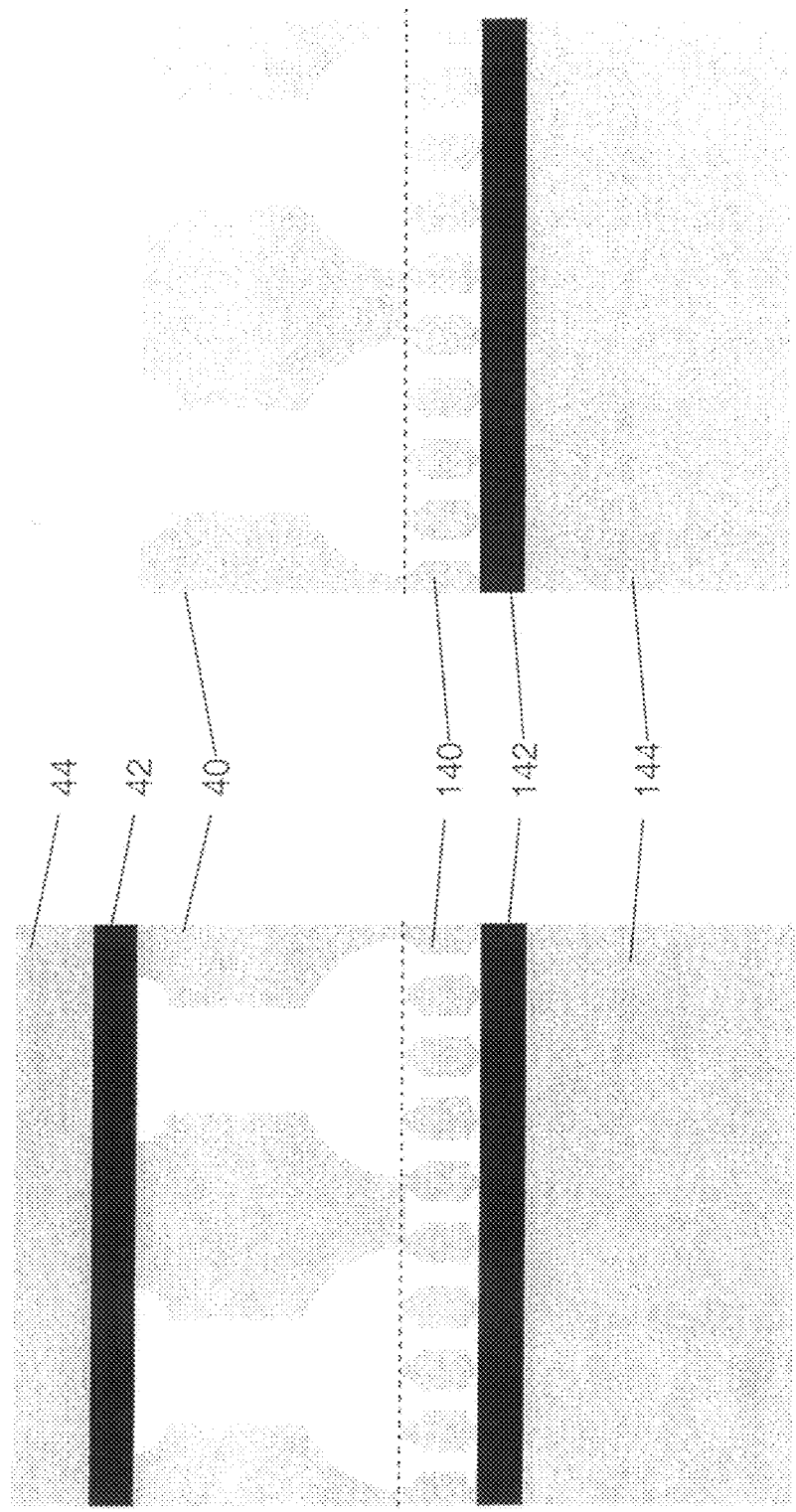

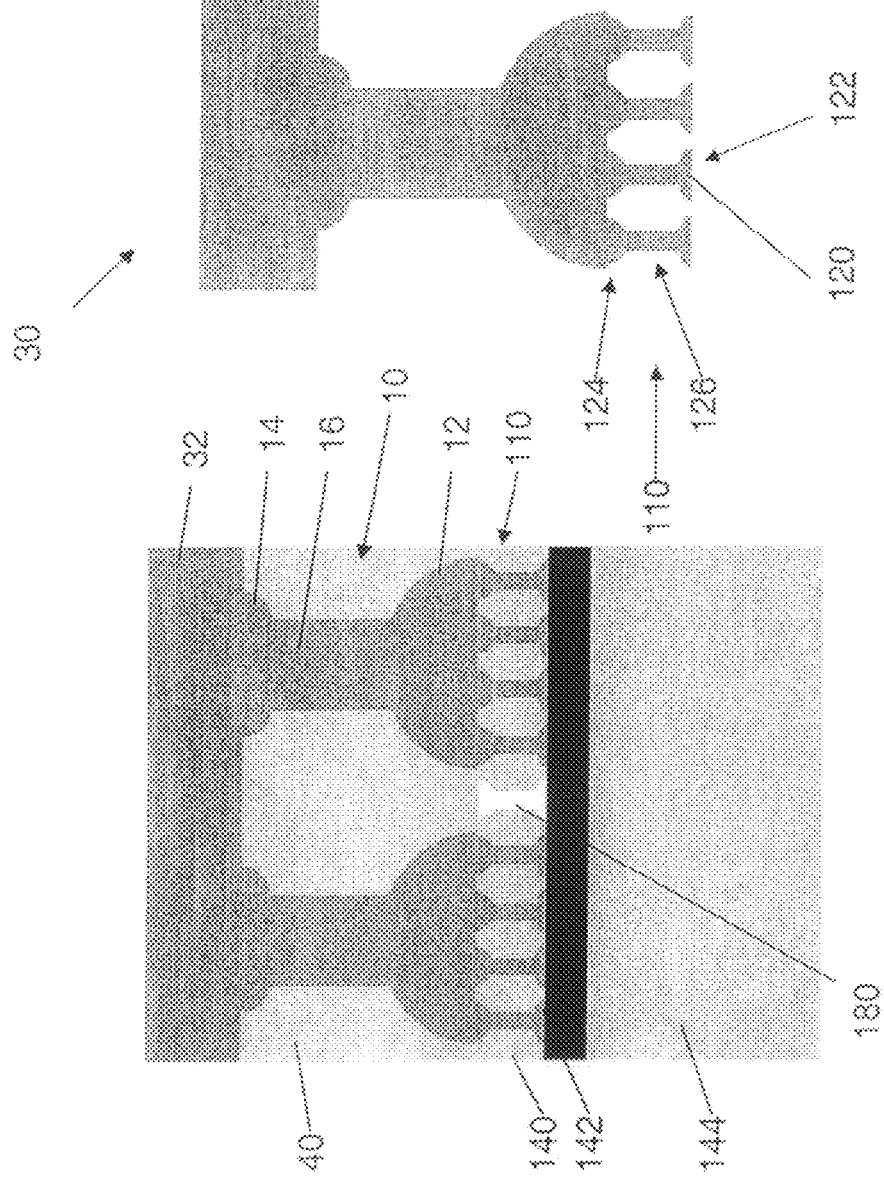

US 8,524,092 B2

DRY ADHESIVES AND METHODS FOR MAKING DRY ADHESIVES

CROSS-REFERENCE TO RELATED APPLICATIONS

This application claims priority from International application number PCT/US2007/025684, filed Dec. 14, 2007, which claims priority from U.S. Provisional Patent Application No. 60/874,787, filed Dec. 14, 2006 and which are incorporated herein by reference. This application is related to U.S. patent application Ser. No. 12/448,242, filed Jun. 12, 2009, Ser. No. 12/562,643, filed Sep. 18, 2009, and Ser. No. 12/562,683, filed Sep. 18, 2009.

STATEMENT REGARDING FEDERALLY-SPONSORED RESEARCH AND DEVELOPMENT

Not Applicable.

FIELD OF THE INVENTION

This invention relates to dry adhesives, and methods for making dry adhesives including, for example, microfibers and nanofibers.

BACKGROUND OF THE INVENTION

There have been recent findings on the mechanisms by which geckos adhere to and climb smooth vertical surfaces. Geckos are exceptional in their ability to climb up smooth vertical surfaces because their hierarchical micro/nanoscale foot-hairs with their spatulate tips can attach to almost any smooth or micro/nanoscale rough surface repeatedly with a controllable adhesion pressure up to around 10 N/cm$^2$ (100 kPa) [K. Autumn, Y. A. Liang, S. T. Hsieh, W. Zesch, W. P. Chan, T. W. Kenny, R. Fearing, and R. J. Full, *Nature*, 405, 681 (2000)]. Recent findings have shown that van der Waals and possibly capillary forces play a dominant role in their fibrillar adhesion [K. Autumn, Y. A. Liang, S. T. Hsieh, W. Zesch, W. P. Chan, T. W. Kenny, R. Fearing, and R. J. Full, *Nature*, 405, 681 (2000)] [K. Autumn, M. Sitti, Y. A. Liang, A. M. Peattie, W. R. Hansen, S. Sponberg, T. W. Kenny, R. Fearing, J. N. Israelachvili, and R. J. Full, *PNAS*, 99, 12252 (2002)] [G. Huber, H. Mantz, R. Spolenak, K. Mecke, K. Jacobs, S, N. Grob, and E. Artz, *PNAS*, 102(45), 16293 (2005)] [G. Huber, S. N. Grob, R. Spolenak, and E Artz, *Biology Letters*, 1, 2 (2005)].

Many adhesion and contact mechanics models for the microfibrillar interfaces have been developed [H. Gao and H. Yao, *PNAS*, 101, 7851 (2004)] [T. Tang, C. Hui, and N. J. Glassmaker, *J. Roy. Soc. Interface*, 2, 505 (2005)] [N. J. Glassmaker, A. Jagota, C. Hui, and J. Kim, *J. Roy. Soc. Interface*, 1, 1 (2004)] [C. Hui, N. J. Glassmaker, T. Tang, and A. Jagota, *J. Roy. Soc. Interface*, 1, 35 (2004)] [B. N. J. Persson, *J. Chemical Physics*, 118, 7614 (2003)] [A. J. Crosby, M. Hageman, and A. Duncan, *Langmuir*, 21, 11738 (2005)] and synthetic fibrillar adhesives have been attempted to be fabricated. Fabrication methods for recent micro/nanoscale synthetic dry adhesives consist of electron-beam lithography [A. K. Geim, S. V. Dubnos, I. V. Grigorieva, K. S. Novoselov, A. A. Zhukov, and S. Y. Shapoval, *Nature Materials*, 2, 461 (2003)], replication of templates using molding or casting [D. Campolo, S. Jones, and R. S. Fearing, *Proc. of the IEEE Nanotechnology Conf.*, 12 (2003)], drawing [H. E. Jeong, S. H. Lee, P. Kim, and K. Y. Suh, *Nano Letters*, 6, 1508 (2006)], printing [M. Sitti and R. S. Fearing, *J. Adhesion Science and Technology*, 17(8), 1055 (2003)], growing [Y. Zhao, T. Tong, L. Delzeit, A. Kashani, M. Meyyappan, and A. Majumdar, *J. Vac. Sci. Techno. B*, 24(1), 331 (2006)], and more complex microfabrication combined with self-assembly [M. T. Northen and K. L. Turner, *Nanotechnology*, 16, 1159 (2005)]. These works focused on fabricating micro/nanoscale high aspect ratio and high density polymer or carbon nanotube fibers on a flat substrate.

Some researchers have attempted to recreate the spatulate tips that occur naturally on gecko hairs as such broadened tips on fibers provide additional surface area, promoting adherence, while acting to prevent clumping of the fibers.

U.S. Pat. No. 6,722,026 discloses a method of removably adhering a semiconductor substrate with microfibers which possess spatulate tips, but does not disclose a method for fabrication of such spatulate tips. U.S. patent application Ser. No. 11/281,768 (published as US 2006-0202355 A1) discloses a variety of formulae for enhancing friction of fibers and mentions fibers with T-shaped ends, but does not describe a method of fabrication for such T-shaped ends.

U.S. Pat. No. 6,737,160 and U.S. patent application Ser. No. 10/039,574 (published as US 2003 0124312 A1), Ser. No. 10/655,271 (published as US 2005 0072509 A1), Ser. No. 10/747,923 (published as US 2005 0148984 A1) and Ser. No. 11/030,752 (published as US 2005 0151385 A1) describe the use of microfibers as dry adhesives, and describe several methods for the fabrication of spatulate tips on such microfibers. One method uses an oxide/nitride semiconductor process to fabricate the shafts, the ends of which are then roughened to produce spatula. This method can not make spatulate tips. Another described method uses a pipette, through which a liquid polymer is extruded until a hemispherical drop forms at the end of the pipette, which could then be flattened against a smooth surface to create a flat spatulate tip. This method can allow only micrometer scale fibers due to the diameter limitation of micro-pipettes. Another described method to fabricate spatulate tips is lithographically induced self-construction. This technique uses electrostatic attraction to pull liquid through a mask, to thereby 'sprout' spatulae. This could enable micro/nano-meter scale low aspect ratio fibers with no tips. A third method described to fabricate spatulate tips involves the use of a nano-imprinting roller. This could also enable micro/nano-meter scale low aspect ratio fibers with no tips. A final method uses a two-layer photoresist process to make fibers with tips. This method can only make fibers with tips from photoresist polymers, which are very brittle.

U.S. patent application Ser. No. 10/863,129 (published as US 2005-0271869-A1) and Ser. No. 10/982,324 (published as US-2005-0271870-A1) disclose a method for forming hierarchical structures of microfibers with smaller microfibrils attached to the end. In one embodiment, these applications describe a method to fabricate microstructures with broader tips on narrow shafts that could be considered to be spatulate tips. This method uses a time multiplexed deep etching process, such as the Bosch process to etch wells in a substrate. Through alternation of etching and passivation, the process can produce an array of microfibers with large heads on top of narrow shafts. This process can make microfibers with flat tips from only silicon type of stiff and brittle materials that can be etched in the Bosch process.

The microfiber fabrication methods described above are very expensive for producing commercial quantities of adhesive materials. Therefore there is a need for better methods for economically producing microfiber-based dry adhesives. Moreover, fibers with flat tips and diameters of hundreds of nanometer can not be reliably fabricated from wide range of polymer materials in the above processes.

Accordingly, there is a need for improved dry adhesives and improved methods for making dry adhesives. In particular, there is a need for dry adhesives having greater adhesive forces and improved durability. In addition, there is a need for methods of making dry adhesives with lower costs of production. Those and other advantages of the present invention will be described in more detail hereinbelow.

SUMMARY OF THE INVENTION

The present invention is directed to dry adhesives and methods for making dry adhesives. Prior art efforts to produce microfiber-based dry adhesives have not produced adhesive forces of magnitudes equal to those produced by gecko adhesion, have not shown acceptable durability, and have suffered from very high costs of production, making them commercially infeasible. The present invention provides dry adhesives and methods for fabrication of dry adhesives which provide superior adhesive qualities, and does so in a manner which is reproducible, scalable and cost effective.

The present invention provides improved dry adhesive materials and methods for fabrication of dry adhesive materials. These dry adhesive materials may be, for example, micro- and nanofiber-based materials. In particular, the present invention provides methods for the fabrication of such fibers which will produce flat tips on the fibers. These tips are sometimes described herein as being "spatulate" tips, although the present invention may be used to form flattened tips of many shapes and is not limited to only forming spatulate tips.

According to one embodiment, the present invention includes a method of forming a dry adhesive fiber in a structure including an etch layer and a barrier layer, wherein the etch layer and the barrier layer are adjacent to each other and are made from different materials. The method includes forming an opening through the etch layer and to the barrier layer, expanding the opening in the etch layer at the barrier layer, filling the opening with a material, removing the barrier layer from the material in the opening, and removing the etch layer from the material in the opening.

According to another embodiment, the method includes forming a plurality of dry adhesive fibers including forming a plurality of openings through the etch layer and to the barrier layer, expanding the openings in the etch layer at the barrier layer, filling the openings with a material, forming a backing layer over the openings and on a surface of the etch layer opposite the barrier layer wherein the material in a plurality of the openings is connected via the backing layer, removing the barrier layer from the material in the openings, and removing the etch layer from the material in the opening and from the backing layer.

According to another embodiment, the present invention includes a dry adhesive fiber. The fiber includes a tip having a flat surface, a layer of fluorocarbon on the flat surface of the tip, a base, a stem connecting the tip and the base wherein the stem has a surface, and a hydrophobic and low surface energy layer on the surface of the stem.

According to another embodiment, the present invention includes a dry adhesive including a plurality of fibers, with each of the fibers including a tip having a flat surface, a layer of fluorocarbon on the flat surface of the tip, a base, a stem connecting the tip and the base wherein the stem has a surface, and a hydrophobic and low surface energy layer on the surface of the stem. In addition, the dry adhesive includes a backing layer connected to the bases of the plurality of fibers.

According to another embodiment, the present includes a dry adhesive fiber array including two or more layers of dry adhesive fibers.

Many variations are possible with the method and fiber according to the present invention. For example, fibers may be formed by molding a master template fabricated using deep reactive ion etching and the notching effect in the following steps: (a) A silicon-on-insulator wafer top surface is patterned using optical lithography; (b) A negative fiber array template is formed using a two-step deep reactive ion etching process: At first, isotropic etching is conducted for forming circular supporting base of each fiber; then, DRIE is followed for the vertical walls, and the notching effect on the oxide layer forms a template for molding fibers with spatulate flat tips; (c) The template is filled with a liquid polymer under vacuum and the polymer is cured, or it is filled by gas phase deposition of a polymer; and (d) Polymer fiber arrays with spatulate tips and a backing layer are released from the template: The bottom silicon layer is etched away by $XeF_2$ dry etching; thin oxide layer is removed by buffered oxide etching; top silicon layer is etched away by $XeF_2$ etching.

Many other variations are possible with the present invention. For example, different materials may be used to make the fibers and the dry adhesive, and the geometry and structure of the fibers and the dry adhesive may vary. In addition, different types of etching and other material removal processes, as well as different deposition and other fabrication processes may also be used. These and other teachings, variations, and advantages of the present invention will become apparent from the following detailed description of the invention.

BRIEF DESCRIPTION OF THE DRAWINGS

Embodiments of the present invention will now be described, by way of example only, with reference to the accompanying drawings for the purpose of illustrating the embodiments, and not for purposes of limiting the invention, wherein:

FIGS. 4a-4h illustrate one embodiment of a method of forming a two layer fiber array 30 according to the present invention.

DETAILED DESCRIPTION OF THE INVENTION

The present invention is directed to dry adhesives and methods for making dry adhesives. The term "dry adhesive", as used herein, refers generally to individual dry adhesive fibers and also to materials including a plurality of dry adhesive fibers connected together. The present invention will also be described in terms of micro- and nanofibers, although the present invention is applicable to a wide variety of sizes and is not necessarily limited to a particular size range.

Figure 1:
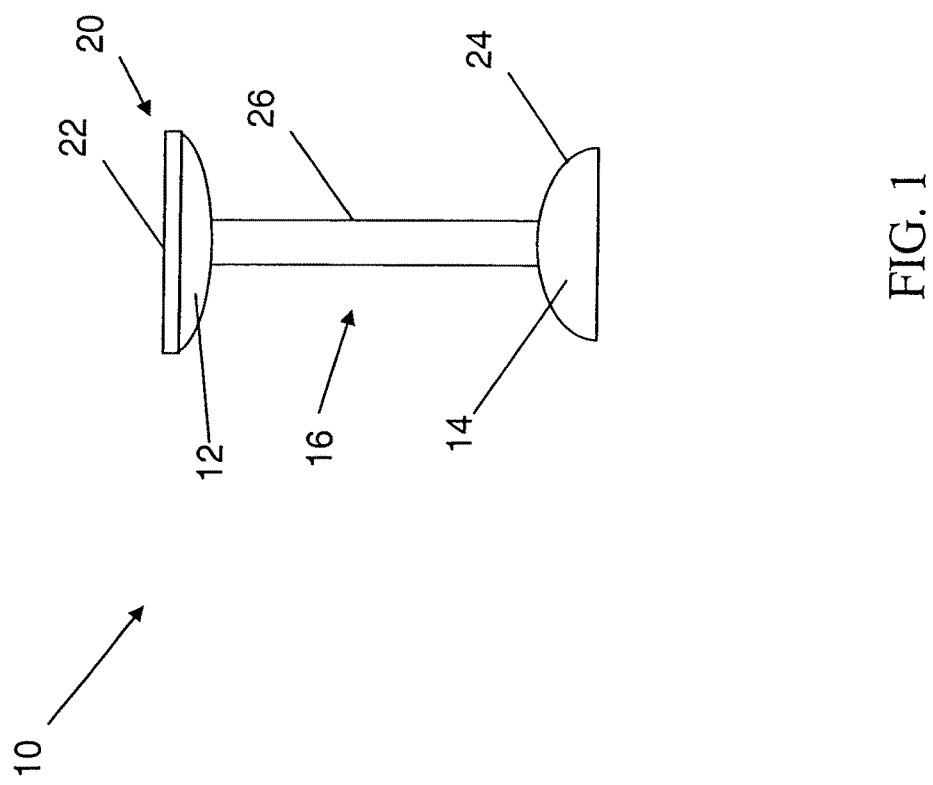
FIG. 1 illustrates one embodiment of a dry adhesive fiber according to the present invention.

FIG. 1 illustrates one embodiment of a dry adhesive fiber 10 according to the present invention. In that embodiment, the fiber 10 includes a tip 12, a base 14, and a stem 16. The shape of the fiber 10 and the relative size of the various parts of the fiber 10 can vary from that shown in the figure. Different applications and materials, for example, can make different shapes and sizes desirable, and such variations are within the scope of the present invention.

The tip 12 includes a flat surface 20. A layer of fluorocarbon 22 may be on the flat surface 20, as described hereinbelow. The layer of fluorocarbon 22 may be of varying thickness, and is not necessarily shown to scale in FIG. 1. In this particular illustration, the layer of fluorocarbon 22 is shown as being relatively thick for the purpose of illustration.

Figure 2:
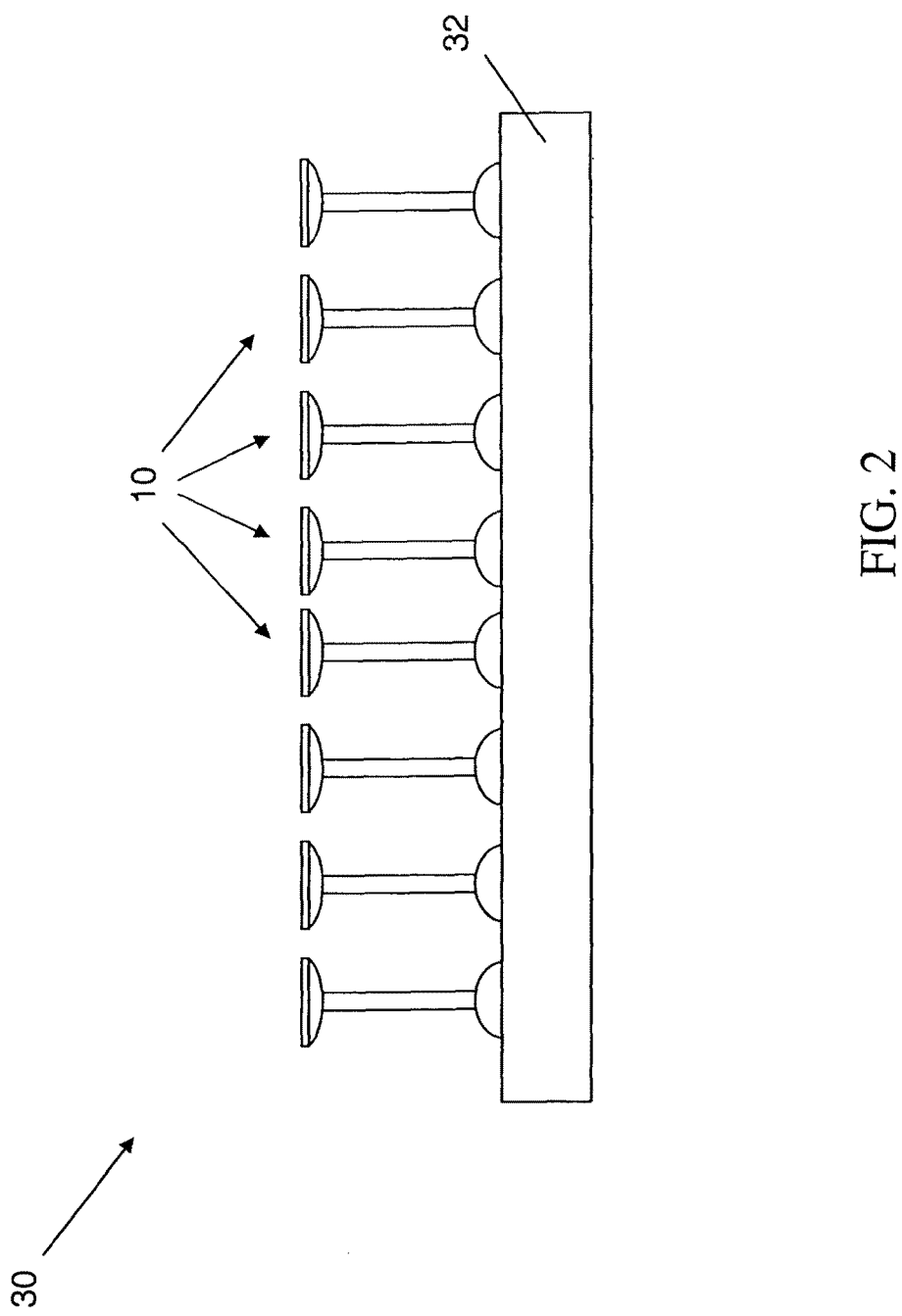
FIG. 2 illustrates one embodiment of a dry adhesive including a plurality of fibers attached to a backing layer.

The base 14 is opposite the tip 12 and is often attached to a backing layer, as is described in more detail with respect to FIG. 2. The base 14 is illustrated as being thicker than the stem 16 and is also illustrated as including a curved surface 24 extending outward from the stem 16 to the edge of the base 14. The relatively large, curved shape of the base 14 allows the base 14 to better withstand strain causes by the bending of the fiber 10, thereby providing for greater durability of the fiber 10. However, in other embodiments the base 14 may have different shapes and sizes. For example, the base 14 may be thinner than the stem or of the same thickness as the stem 16. For example, the base 14 may be indistinguishable from the stem 16 in size and shape, although it is still the base 14 because it represents the end of the fiber 10 that is typically attached to another structure, such as a backing layer.

The stem 16 connects the tip 12 and the base 14. The stem 16 may also include a hydrophobic layer 26 as will be described in more detail hereinbelow. The stem 16 is shown as being at right angles to both the tip 12 and the base 14. However, in other embodiments the stem 16 may be oriented differently, such as at an oblique angle with respect to one or both of the tip 12 and the base 14. In addition, the stem 16 is illustrated as being straight, although the stem 16 may be made to be curved or to have other non-straight characteristics.

FIG. 2 illustrates one embodiment of a dry adhesive structure 30 including a plurality of fibers 10 attached to a backing layer 32. The combination of a plurality of fibers 10 connected to a backing layer 32 will sometimes also be referred to herein as an array 30 or a fiber array 30. The backing layer 32 is connected to the bases 14 of the fibers 10. The dry adhesive structure 30 is not limited to the specifics illustrated in FIG. 2. On the contrary, a dry adhesive 30 according to the present invention may be made in different sizes, with different numbers of fibers 10 having different spacings and different shapes and dimensions. The number of fibers 10, their spacing, dimensions, and other characteristics of the dry adhesive 30 may be uniform or may vary. For example, the dry adhesive 30 may have alternating patterns of fiber sizes and spacings, or the shape of the fibers 10 may be different in different parts of the dry adhesive 30. Many other variations are also possible.

The backing layer 32 may be the same as the material used to make the fibers 10, or the backing layer 32 may be made from a different material. The thickness of the backing layer 32 can have a significant affect on the performance of the fiber array 30, and this is discussed in more detail hereinbelow.

FIGS. 3a-3d illustrate a method of making a dry adhesive according to one embodiment of the present invention.

Figure 3A:
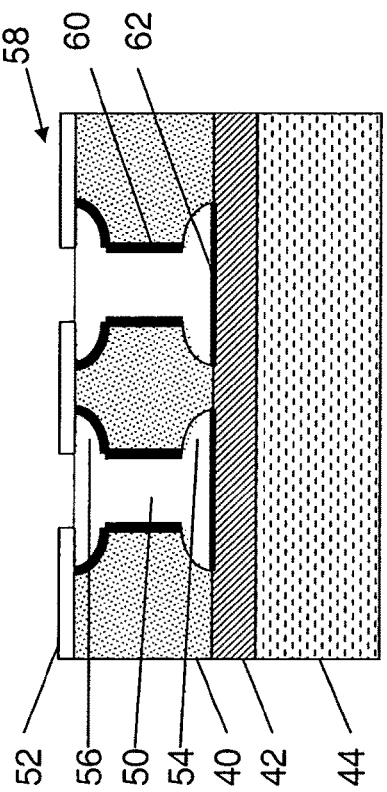
FIGS. 3A-D is a Schematic illustration of process flow steps for the fabrication of microfiber arrays according to one embodiment of the present invention.

FIG. 3a illustrates the basic structure in which a dry adhesive is formed. The structure includes an etch layer 40 and a barrier layer 42, as well as a substrate 44 on which the etch 40 and barrier 42 layers are formed. The etch layer 40 and the barrier layer 42 are adjacent to each other and are made from different materials. FIG. 3a is not necessarily to scale, and the dimensions and shapes of the various parts of the structure may vary depending on the particular application.

The etch layer 42 may be a single, homogenous layer, or it may be formed from and include more than one layer of the same or different materials. As used herein, etch layer 40 means one or more layers which are etched or from which material is otherwise removed so as to form the structure described herein. In the illustrated embodiment, the etch layer 40 is changed so as to form a mold for use in manufacturing the dry adhesive fibers 10 and the dry adhesive fiber array 30.

The barrier layer 42 may also be made from one or several layers of the same or different materials. The barrier layer 42 is made from a different material having different properties than the etch layer 40. Unlike the etch layer 40, the barrier layer 42 acts as a stop and does not dramatically change its shape during the manufacturing process. The barrier layer 42 maintains a relatively constant-flat shape that is used to form the flat surfaces 20 on the tips 12 of the fibers 10.

In practice, the barrier layer 42 will lose some material during the formation of the openings, which are described below. However, this loss of material is very small compared to that of the etch layer 40, and the concept of barrier materials is well understood in the art. As used herein, barrier layer 42 generally means the one or more layers which form a border of the openings 50 (described below) but which are not significantly etched or from which significant material is not otherwise removed during the formation of the openings 50, which are described below.

The barrier layer 42 is generally described as having a flat shape, although in other embodiments the barrier layer 42 may be formed otherwise so as to form different shapes for the tips 12 of the fibers 10. For example, the barrier layer 42 may be formed with a curved shape, or with a surface having other features such as recesses or protrusions.

The substrate 44 may be used in connection with the etch 40 and barrier 42 layers. However, in methods where the substrate 44 is not required to form and/or to support the etch 40 and barrier 42 layers, the substrate layer 44 may be omitted.

Figure 3C:
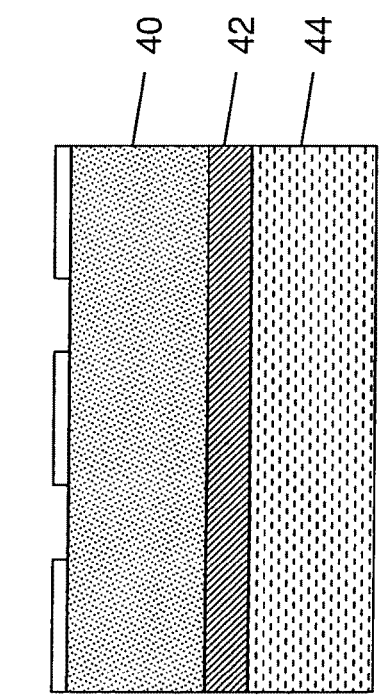
Figure 3B:
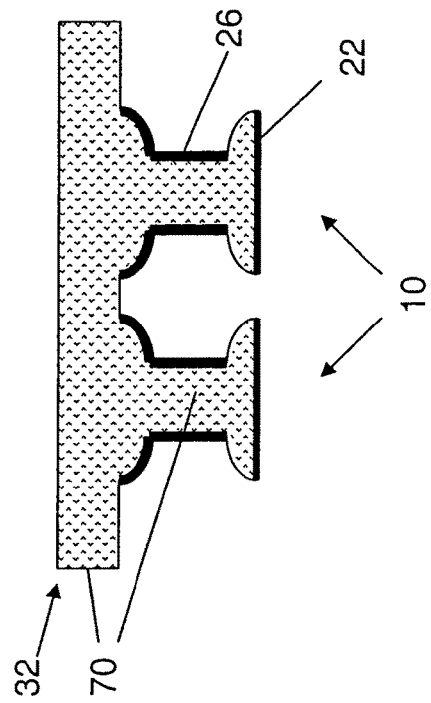

With reference to FIG. 3b, openings 50 are formed in the etch layer 40. The openings 50 are formed through the etch layer 40 and to the barrier layer 42. The openings 50 may be created, for example, by forming a patterned layer 52 on the surface of the etch layer 40 and then exposing the structure to an etching process or to other processes for removing the exposed material from the etch layer 40. The patterned layer 52 may be photoresist, a contact mask, or some other material used to selectively expose portions of the etch layer 40. In other embodiments, the patterned layer 52 may be omitted and the openings may be formed directly, such as through e-beam processes.

After the openings 50 are formed, the openings 50 are expanded in the etch layer 40 at the barrier layer 42 to form expanded openings 54 which will shape the tip 12 of the fibers 10. The process of forming the expanded openings 54 will be described in more detail hereinbelow.

The openings 50 may also be expanded 56 near the top surface 58 of the etch layer 40, on the surface 58 opposite the barrier layer 42. This expanded opening 56 will shape the base 14 of the fibers 10. By expanding 56 the opening 50, the base 14 will be thicker than the stem 16. Furthermore, if the expanded opening 56 is given a rounded shape, it will cause the base 14 to be formed with a rounded shape, as described herein. The formation of this expanded opening 56 may, for example, be performed with an isotropic etch prior to the formation of the opening 50 and may be performed in the portions of the etch layer 40 not covered by the patterning layer 52.

The process of forming the openings 50 may, under some processes, form a layer of hydrophobic material 60 on the side walls of the openings. Similarly, under some processes, a fluorocarbon layer 62 may be formed on the barrier layer 42 where the flat surface 20 of the tip 12 will be formed. This fluorocarbon layer 62 has been found to cause increased adhesion at the flat surface 20 of the tip 12. The hydrophobic layer 60 is a smooth, non-stick surface which is also advantageous. The formation of these layers 60 and 62 will be described in more detail hereinbelow.

After the openings 50, 54, 56 are formed, the photoresist or other patterned layer 52 may be removed.

With reference to FIG. 3c, after the openings 50 are formed, they are filled with a material 70. The material 70 may be a polymer, a metal, or any other material from which the fibers 10 can be made. After the openings 50 are filled with the material 70, the backing layer 32 may be formed over the openings 50 and on the surface 58 of the etch layer 40 opposite the barrier layer 42. The material 70 in the openings 50 is connected together via the backing layer 32, forming a single structure including a plurality of fibers 10 and the backing layer 32.

The backing layer 32 may be formed in several ways. The backing layer 32 may be formed separately from the material 70 filling the openings 50 and applied over the openings 50 and on the surface 58 of the etch layer 40. Alternatively, the backing layer 32 may be formed from the same material 70 as that used in the openings 50, in which case, for example, the process of filling the openings 50 may be allowed to continue after the openings 50 are filled, so that the material 70 fills the surface 58 over the openings 50 to form the backing layer 32. A mold (not shown) may be formed on top 58 of the etching layer 40 to contain the extra material 70 used to form the backing layer 32. In addition, a step of compressing or squeezing the material forming the backing layer 32 may also be performed so that the backing layer 32 is formed to a desired thickness. Other methods of controlling the thickness of the backing layer 32 are also possible, such as by trimming or cutting excessive backing layer 32 material. The thickness of the backing layer 32 can have a significant affect on the performance of the fiber array 30, and will be discussed in more detail hereinbelow With reference to FIG. 3d, after the material 70 in the openings 50 has cured or otherwise achieves a desired state, the etch layer 40 and barrier layer 42 may be removed from the material 70, leaving the molded dry adhesive fibers 10 and backing layer 32. In addition, the substrate layer 44 may also be removed if it was used.

The use of wet etch processes for the removal of the etch layer 40 tend to cause "clumping" of, or an attraction between, adjacent fibers 10. This is caused by hydrostatic pressure from the liquid remaining from the wet etching. It has been found that dry etch processes are particularly advantageous for removing the etch layer 40 and reducing or eliminating the clumping or lateral or vertical collapsing of fibers. However, the use of a dry etch process is not required with the present invention, and other processes may be used. For example, supercritical carbon dioxide ($CO_2$) drying can be used to release the fibers without clumping or collapsing issues where after wet etching of the etch layer, released fibers can be soaked in liquid $CO_2$, heated and applied pressure over the supercritical point to remove $CO_2$.

Although this embodiment of the method has been described in terms of making several fibers 10 attached to a backing layer 32, the present invention may also be used to make a single fiber 10, or to make a plurality of fibers 10 that are not connected to a backing layer 32. Furthermore, the present invention may also include two or more layers of fibers 10 or fiber arrays 30 having two or more layers of fibers 10.

FIGS. 4a-4h illustrate one embodiment of a method of forming a two layer fiber array 30 according to the present invention. In this embodiment, the two layers of fibers are different sizes. The smaller fibers 110 (shown in FIGS. 4g and 4h) may be smaller in volume, or smaller in their dimensions. Alternatively, it is also possible to form a multi-layer fiber array 30 in which the different layers of fibers are the same size.

Figure 4B:
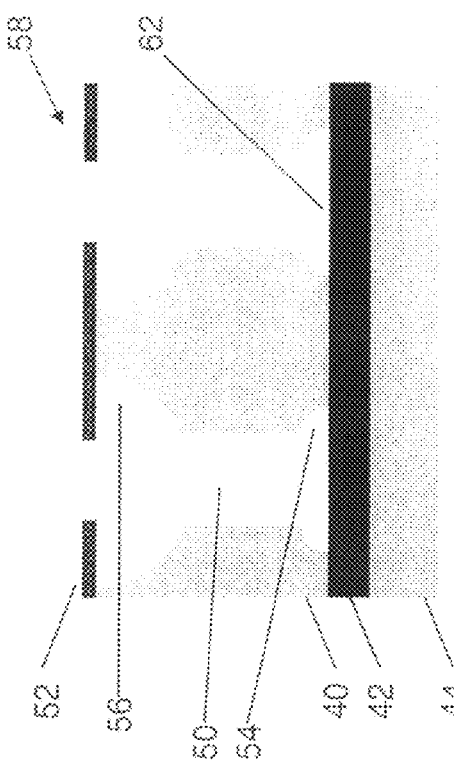
Figure 4D:
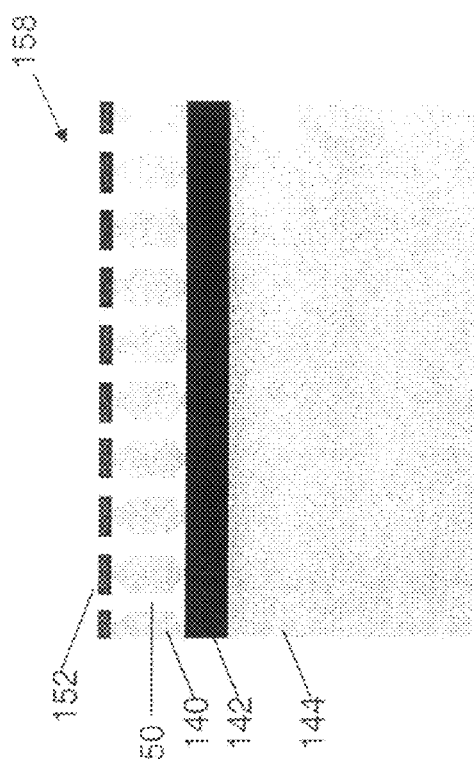
Figure 4A:
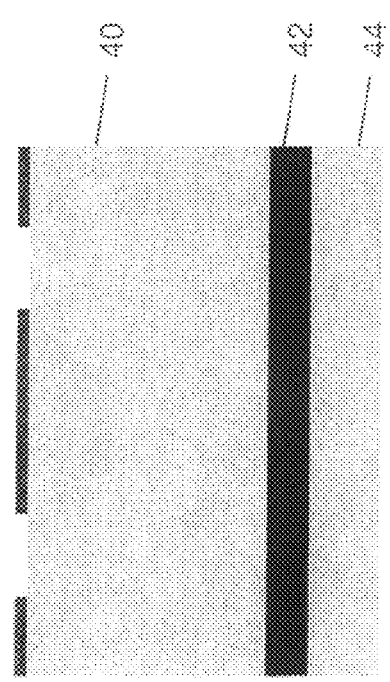

FIGS. 4a and 4b are analogous to FIGS. 3a and 3b and they illustrate the first structure in which the openings 50 are created and in which the first layer of fibers 10 will be formed.

Figure 4C:
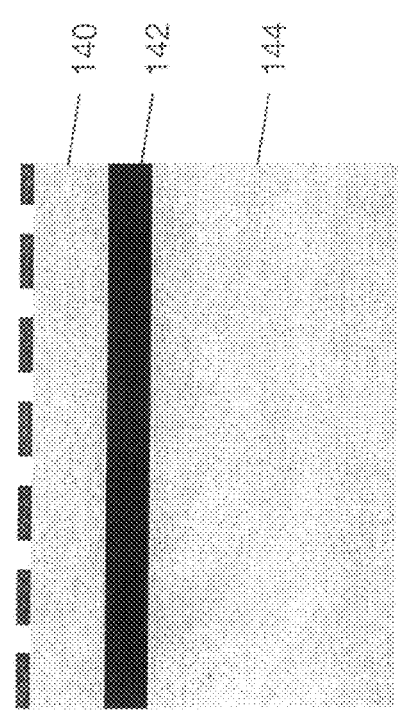

FIGS. 4c and 4d illustrate the second structure in which the second layer of fibers 110 is formed. In the illustrated embodiment, the second structure includes an etch layer 140 and a barrier layer 142, as well as a substrate 144 on which the etch 140 and barrier 142 layers are formed. The etch layer 140 and the barrier layer 142 are adjacent to each other and are made from different materials. The second structure may include the same or different elements as those described hereinabove with respect to FIGS. 3a and 3b. In other words, the openings 150 in the second structure may have the same features as the openings 50 in the first structure, although they differ in their size. FIG. 4a is not necessarily to scale, and the particular dimensions of the various parts of the structure may vary depending on the particular application.

FIGS. 4c and 4d are similar to FIGS. 4a and 4b, except that the fibers 110 to be formed in the process of FIGS. 4c and 4d are smaller than those formed in the process of FIGS. 4a and 4b. For example, FIG. 4a may represent a process with a twenty μm thick etch layer 40, three μm diameter openings 50, and twelve μm spacing between opening 50 centers. In contrast, FIG. 4c may represent a process with a two μm thick etch layer 140, a 300 nm diameter openings 150, and 800 nm spacing between opening 150 centers.

Similarly, the etching process of both FIGS. 4b and 4d may be, for example, a dry etching process. That process may include isotropic etching, followed by deep reactive ion etching, and then expanding the opening 50, 150 near the barrier layer 42, 142 to form a desired shape for the base 14, 114 of the fibers 10, 110.

However, variations are also possible with this aspects of the present invention and, for example, the second fibers 110 may be larger than the first fibers 10.

FIG. 4e illustrates the structures of FIGS. 4b and 4d being connected together. The dashed line illustrates where the two structures are joined together. When connected, the structures are oriented so that the openings 50, 150 correspond to or engage with each other. In other words, the exposed openings 50 in the first structure corresponding to or engage with exposed openings 150 in FIG. 4d. This orientation is accomplished in FIG. 4e by rotating the top structure 180 degrees before connecting the two together.

This connection may be formed, for example, by silicon fusion bonding or by other processes. In one embodiment, the bonding is accomplished with ten minutes of piranha cleaning to remove photoresist and anti-reflective coating. Followed by ten minutes of oxygen plasma etching to remove the film that is natively generated in the openings 50, 150 during deep reactive ion etching. Followed by ten minutes of piranha cleaning for final surface cleaning. After the final cleaning, the two structures are pressed to each other and annealed at 1,000 degrees Celsius in a quartz furnace to bond them.

FIG. 4f illustrates the bonded structure after the top layers (the barrier layer 42 and substrate 44) are removed. This may be done, for example, with a buffered oxide etching process. The resulting structure is a two layer mold open at the top where the barrier layer 42 and substrate 44 used to be.

FIG. 4g illustrates the two layer structure after being filled with a material 70. As described above, the material 70 may by any of many different materials, and this process may be, but is not required to be, performed in a vacuum chamber.

FIG. 4g also illustrates that not all of the second openings 150 are necessarily utilized. In this embodiment, one of the second openings 180 is not connected to the first openings 50 and, therefore, that opening 180 is not filled with material 70.

FIG. 4h illustrates the resulting two layer fiber array 30 after the surrounding structure or mold (the remaining etch layers 40, 140, the second barrier layer 142, and the second substrate 144) has been removed. The removal may be performed, for example, with a $XeF_2$ etch to remove the bottom silicon layer and a buffered oxide etch to remove the oxide layer, as described above with respect to FIGS. 3a-3d. A further $XeF_2$ etch may be used to remove the upper silicon layer.

Although the present invention has been described in terms of a two layer fiber array 30, the present invention may also be used to produce a fiber array 30 having more than two layers. Furthermore, the present invention is not limited to multilayer fiber arrays 30, and it may also be used, for example, to make multilayer individual fibers and to make other structures.

The theory related to the present invention will now be presented. Flat and larger diameter spatulate tips 12 are postulated to enhance the adhesion and work of adhesion significantly due to the increased tip contact area at the fiber-surface interface [H. Gao and H. Yao, *PNAS*, 101, 7851 (2004)]. In order to model the work of adhesion enhancement approximately, a single polymer fiber 10 is assumed to be stretched while its volume is conserved. In addition, if pull-off of each fiber tip 12 is assumed to happen simultaneously where overall pull-off force per unit area is a constant value ($c_1$) and the elastic deformation is assumed to happen at the fiber stem 16 only where the polymer Young's modulus (E) is assumed to be constant. Then, the maximum stretched length ($x_c$) and work of adhesion (W) of a single fiber 10 during separation can be computed as $$x_c = x_0 \frac{Ed_0^2}{Ed_0^2 - c_1 D^2} \quad (1)$$

$$W = \int_{x_0}^{x_c} F\, dx = \pi E \frac{d_0^2 x_0}{4} \left[ \frac{c_1 D^2}{Ed_0^2 - c_1 D^2} - \ln \frac{Ed_0^2}{Ed_0^2 - c_1 D^2} \right] \quad (2)$$

where $x_0$ is the initial stem 16 length, D is the fiber spatulate tip 12 diameter, and $d_0$ is the fiber stem 16 diameter. From (1) and (2), elastomer fibers 10 with larger diameter tips 12 elongate and dissipate energy significantly, and thus the work of adhesion per fiber 10 is increased. Moreover, adhesion is also increased by a fiber array 30 with larger flat spatulate tips 12 since: (1) The fracture mechanics of the microfibers is flaw insensitive [M. Murphy, B. Aksak, and M. Sitti, *Langmuir*, under review (2006)] (the stress at the interface is uniform and equal to the intrinsic adhesion strength at the instant of pull-off) and thus enables the maximum possible adhesion pressure; (2) Flat and compliant spatulate tips 12 enable easier contact to a smooth surface with almost no alignment problem; (3) Fiber stretching enables larger number of fibers 10 staying in contact with a smooth surface during pull-off. Therefore, this invention is focused on fabrication of polymer microfibers 10 with flat and larger spatulate tips 12 for fibrillar adhesives with improved adhesion capability.

Figure 3D:
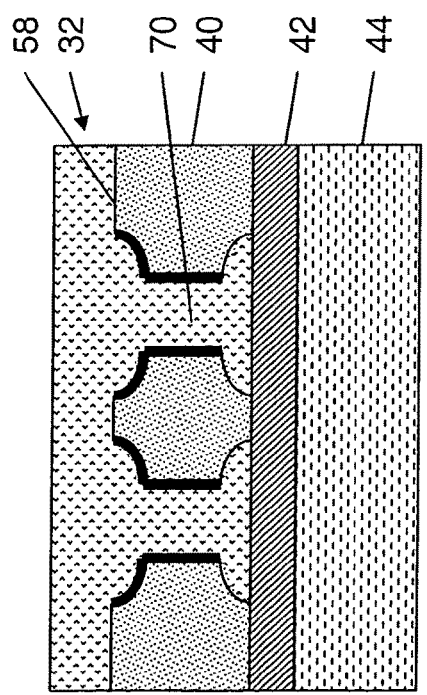

One embodiment of the fabrication process according to the present invention will now be provided. The present invention is not limited to the specifics details of this embodiment, and these details are illustrative of the present invention, and not limiting. FIG. 3a-d illustrates one embodiment of the fabrication process of polymer microfibers with flat and larger diameter spatulate tips 12. FIG. 3a illustrates a silicon-on-insulator (SOI) wafer (purchased from Addison Engineering) which is used as a substrate 44 which has 20 μM thick top silicon layer as the etch layer 40 and 0.5 μm thick $SiO_2$ layer as the barrier layer 42. After an optical lithography step forms a desired pattern 52 on the top 58 of the etch layer 40, the negative fiber array template is formed in FIG. 3(b). The required fiber profile shape is obtained in two steps. At first, isotropic etching is used for forming the circular supporting shape 56 of the base 14 of each fiber 10 to reduce the stress concentration for preventing the fracture of fibers 10 at their bases 14. Next, deep reactive ion etching (DRIE) is followed for forming vertical high aspect ratio microchannels 50. Isotropic etching and DRIE were carried out consecutively in STS Multiplex ICP RIE with 20 mT pressure, 130 sccm $SF_6$, 20 sccm $O_2$, 600 W coil power, and 120 W platen power. When the vertical etching reaches to the silicon oxide layer 42, it can not proceed vertically any more and then starts to expand laterally 54 on the oxide interface between the etch layer 40 and the barrier layer 42. This effect is called the notching effect [M. E. McNie, D. O. King, V. Nayar, M. C. L. Ward, J. S. Burdess, C. Quinn, and S. Blackstone, *Proc. of IEEE International SOI Conference*, 60 (1997)]. By controlling the lateral etching 54 time, the spatulate tip 12 diameter is determined. Then, in FIG. 3(c), the template is filled with a liquid polymer 70 under vacuum to remove not only the trapped air but also the native gas in the liquid polymer 70, and then the polymer 70 is cured. Here, any polymer 70 (e.g. Parylene® C) or any other fiber material 70 can be also gas phase deposited inside to the template 50. In FIG. 3(d), the polymer fiber array 30 with a backing layer 32 is released by three step etching: At first, the bottom silicon layer 44 is etched away by $XeF_2$ dry etching; The thin oxide layer 42 is removed by buffered oxide etching (BOE); Finally, the 20 μm thick top silicon layer 40 is etched away by $XeF_2$ etching in around 30 minutes to release the fibers 10 with a backing layer 32. Here, the final etching step is particularly important. Since using a wet etching technique such as KOH etching would result in clumped fibers 10 due to capillary forces during drying, $XeF_2$ dry etching is used to prevent any clumping issues. Moreover, since the DRIE process natively creates a hydrophobic thin submicron film 60 on the template microchannel 50 side walls during the process [A. A. Ayon, R. Braff, C. C. Lin, H. H. Sawin, and M. A. Schmidt, *J. of Electrochemical Society*, 146(1), 339 (1999)], each released polymer fiber 10 is expected to be coated with this hydrophobic and low surface energy thin film 26 on their side walls 16 (not at the spatulate tip 12 surface 20). The film 60 on the side walls of the openings 50 and the fibers 10 can be characterized as a passivation film or a fluorocarbon thin film. This very low surface energy coating 26 could reduce the cohesion of microfibers 10 significantly, and thus it could minimize any clumping during the mechanical contact of neighboring fibers 10.

Besides forming the flat spatulate tips 12, the above fabrication process has other advantages with respect to previous fibrillar adhesive fabrication methods: (1) Fiber material can be fabricated from any polymer 70 which can be in a liquid solution form or can be gas phase deposited; (2) Array 30 of fibers 10 can be fabricated in large areas up to 8 inch wafer size cost effectively using a single mask; (3) The yield is almost 100%; (4) This method can be extended to the fabrication of hundreds of nanometer diameter fibers 10 easily by using a higher resolution lithography step in FIG. 3a by using phase masks or interference lithography.

Figure 5:
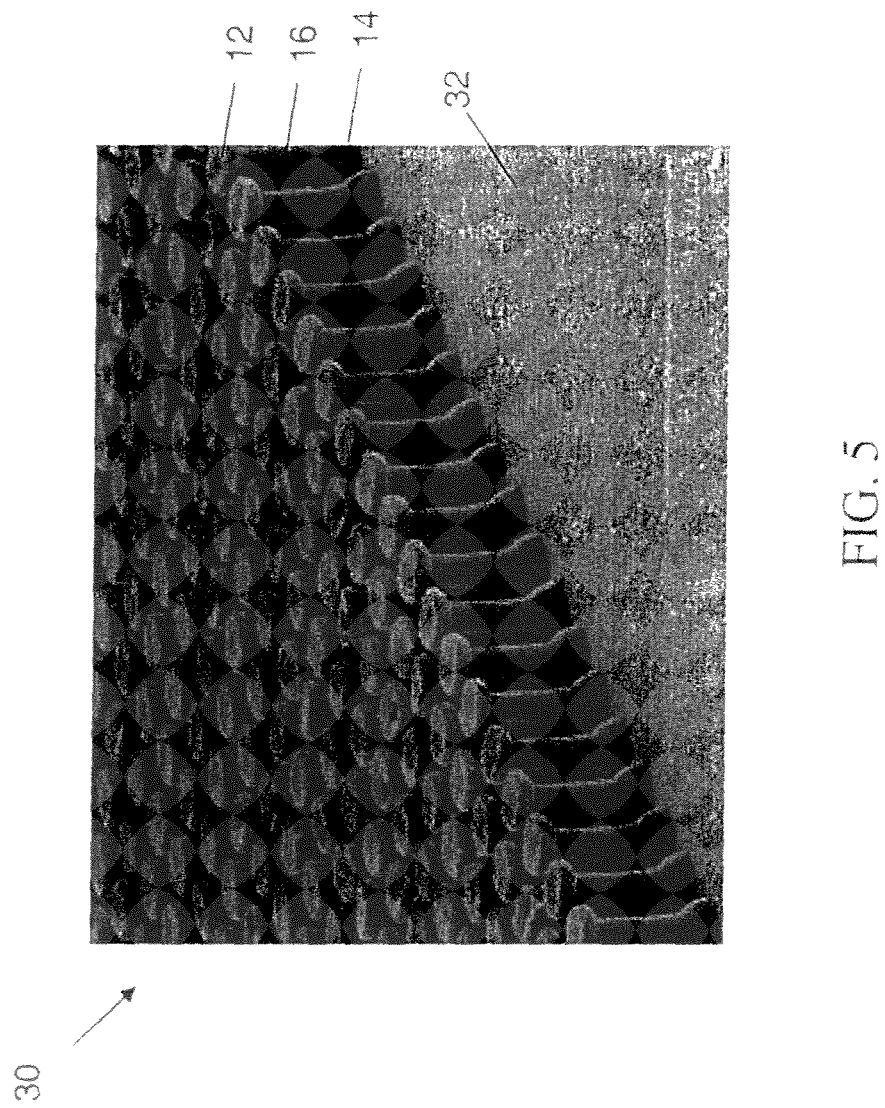
FIG. 5. is a scanning electron microscope image of the isometric view of a polyurethane elastomer microfiber array illustrated in FIG. 3 with 4.5 µm fiber diameter, nine µm tip diameter, 20 µm length, and 44% fiber density (Scale bar: 50 µm).

High tensile strength elastomer polyurethane (ST-1060, BJB Enterprise) with Young's modulus of around 3 MPa was selected as the fiber adhesive material. FIG. 5 illustrates a scanning electron microscope (SEM) (Hitachi 2460N) image of the resulting microfiber array 30 with 4.5 μm fiber diameter, 9 μm tip diameter, 4.5 μm base supporter diameter, 20 μm length, and 12 μm spacing between each fiber center (44% fiber tip area density). These geometries are held by 80 sec isotropic etching for the fiber base supporter structures and by 21 min 20 sec vertical etching for the fiber and spatulate tips 12.

Performance of a fibrillar adhesive is characterized by its macroscale adhesion (P) and overall work of adhesion (W). To characterize these parameters for the fabricated fiber arrays 30 during adhering to a glass hemisphere, a custom tensile macroscale adhesion measurement setup was built. A glass hemisphere instead of a flat glass surface was selected as the test surface in order to have no alignment errors during the measurements. A 6 mm diameter very smooth glass hemisphere (ISP Optics, QU-HS-6) attached to a load cell (Transducer Techniques, GSO-25) was moved vertically by a motorized stage (Newport, MFA-CC) with 100 nm resolution. The hemisphere was contacted to and retracted from the fiber array sample with a pre-specified preload force and a very slow speed (1 μm/s) to minimize any viscoelastic effects. The maximum tensile force during the glass hemisphere and fiber array separation (pull-off force) gave the adhesion, and the hysteresis area between the loading and unloading curves gave the dissipated energy between the loading and unloading of the fiber array. Dividing this dissipated energy by the maximum circular contact area during loading gave $W^{10}$. During the force measurements, an inverted microscope (Nikon Eclipse TE200) is used to measure the real circular maximum contact area between the hemisphere and the fiber array 30.

Adhesion and overall work of adhesion of 15×15 mm² area and one mm thick ST-1060 polyurethane fiber array 30 samples and a 1 mm thick flat and smooth ST-1060 surface were measured on the glass hemisphere using the above setup. The flat polyurethane surface was used as a control substrate to show the relative enhancement of P and W by structuring the same material as a cylindrical microfiber with flat spatulate tips. Since ST-1060 is also etched slightly during the final $XeF_2$ dry etching step in FIG. 1(d), flat sample was also exposed to $XeF_2$ for about 30 minutes to have the same surface roughness with the flat spatulate tip surface.

Figure 6:
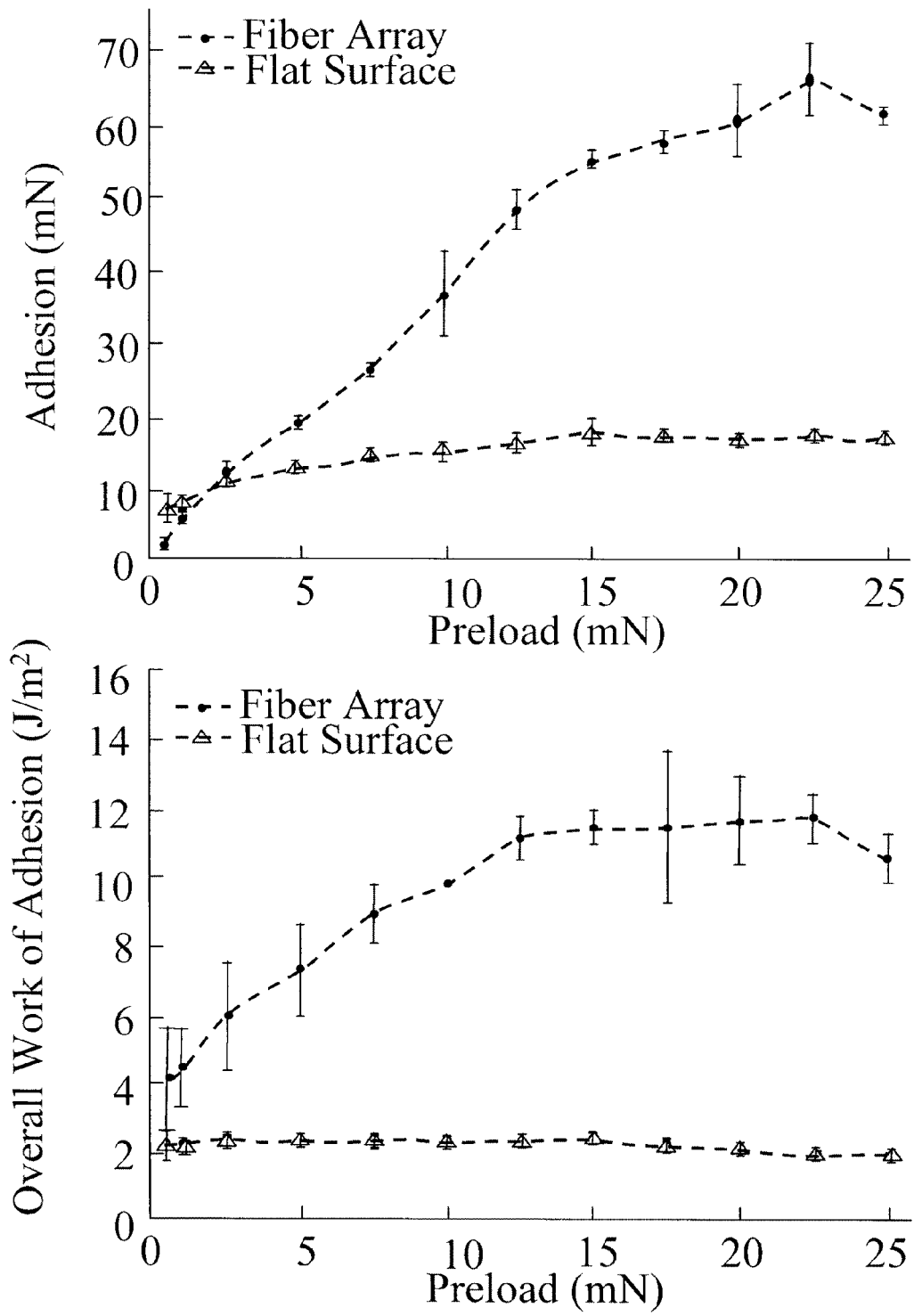
FIG. 6 is a graph of macroscale adhesion (upper plot) and overall work of adhesion (lower plot) of polyurethane microfibers and flat polyurethane flat control surface on a six mm diameter glass hemisphere for varying preloads.

Using the above setup, the fiber array 30 and the glass hemisphere interface adhesion and overall work of adhesion are measured as shown in FIG. 6. Plots show the error bars measured from the force-distance data at two different locations on the fiber array 30 for preloads up to 25 mN. Adhesion values saturate as preload increases, and the array of fibers has around 4 times higher adhesion than the flat surface. Dividing the adhesion to the optically measured maximum circular contact area during loading, maximum adhesion pressure for the fiber array 30 can be computed as 18 N/cm² at a preload pressure of 12 N/cm². Overall work of adhesion of the fibers 10 is five times higher than the one from the flat elastomer surface. This energy dissipation enhancement is due to the lost energy during separating the elastic and highly stretched fibers 10 from the adhered glass surface as given in (2). ST-1060 fibers stretched up to 500% strain in the experiments (observed by profile view optical imaging) which would show the reason of the enhancement of the elastic energy loss during unloading of the fibers 10.

Macroscale adhesion data from the fiber array 30 in this work are compared with the previous works as given in Table 1. Table 1 is a comparison of adhesive strength among various natural and synthetic gecko inspired micro/nanofibers [Y. Zhao, T. Tong, L. Delzeit, A. Kashani, M. Meyyappan, and A. Majumdar, *J. Vac. Sci. Techno. B*, 24(1), 331 (2006)]. The polymer fibers 10 with spatulate tips 12 show better adhesion pressure than other synthetic gecko inspired fibrillar adhesives with no spatulate tips 12 although the single fiber 10 in this work is over 20 times thicker than the single fibers 10 which were fabricated in other works. In order to even increase the adhesion performance in this work, microfibers with tips 12 can be scaled down to hundreds of nanometers in diameter using phase mask type of sub-micron lithography techniques. In addition, N times self-similar scaling down in fiber diameter will generate $\sqrt{N}$ times higher adhesion [E. Arzt, S. Gorb, and R. Spolenak, *PNAS*, 100, 10603 (2003)], and smaller fibers will need less preload than larger fibers to obtain the same adhesion.

TABLE 1

| Materials & Structures | Macroscale Adhesion (N/cm²) |
| --- | --- |
| Gecko (Tokay) foot-hairs with spatulate tips | 10 [Autumn, *Nature*, 405, 681 (2000)] |
| Silicone rubber fibers with 60 μm length and 200 nm diameter | 0.003 [Sitti, *J. Adhesion Science and Technology*, 17(8), 1055 (2003) |
| Polyurethane fibers 20-60 μm length and 200 nm diameter | 0.5 [D. Campolo, S. Jones, and R. S. Fearing, *Proc. of the IEEE Nanotechnology Conf.*, 12 (2003)] |
| Polyimide fibers with 2 μm length and 500 nm diameter | 3 [A. K. Geim, S. V. Dubnos, I. V. Grigorieva, K. S. Novoselov, A. A. Zhukov, and S. Y. Shapoval, *Nature Materials*, 2, 461 (2003)] |
| Polyurethane fibers with 100 μm length and 25 μm diameter | 3.8 [M. Murphy, B. Aksak, and M. Sitti, *Langmuir*, (2007), 23, 3322-3332] |

TABLE 1-continued

| Materials & Structures | Macroscale Adhesion (N/cm$^2$) |
|---|---|
| Multi-walled carbon nanotubes with 40 μm length and 20-30 nm diameter | 11.7 [Y. Zhao, T. Tong, L. Delzeit, A. Kashani, M. Meyyappan, and A. Majumdar, *J. Vac. Sci. Techno. B*, 24(1), 331 (2006)] |
| Polyurethane fibers with 20 μm length, 4.5 μm diameter, and 9 μm spatulate tips | 18 |

The Effect of the Backing Layer Thickness.

It has also be found that the thickness of the backing layer 32 has a greater effect on the performance of dry adhesives than was previously known. The effect of the backing layer 32 thickness on adhesion was investigated for single-level elastomer fibrillar adhesives 30. Polyurethane microfiber arrays 30 with spatulated tips 12 on a 160 μm thick backing layer 32 show nine times greater adhesion strength (around 22 N/cm$^2$) than those with a 1120 μm thick backing 32. A theoretical model is proposed to explain this difference in which very thin backing layers 32 promote equal load sharing, maximizing adhesion, while very thick backings can lead to reduced adhesion due to edge stress concentration. Therefore, backing layer 32 thickness should be considered as a significant parameter for design of high performance fibrillar adhesives.

As discussed above, the adhesion of biologically inspired fibrillar dry adhesive has been studied extensively in combination with developments of various fabrication methods. Based on dominant forces of van der Waals [K. Autumn, M. Sitti, Y. A. Liang, A. M. Peattie, W. R. Hansen, S. Sponberg, T. W. Kenny, R. Fearing, J. N. Israelachvili, and R. J. Full, *PNAS*, 99, 12252 (2002)] and possibly capillary [G. Huber, H. Mantz, R. Spolenak, K. Mecke, K. Jacobs, S. N. Grob, and E. Artz, *PNAS*, 102(45), 16293 (2005)] forces, vertical cylindrical micro/nanofiber arrays [A. K. Geim, S. V. Dubnos, I. V. Grigorieva, K. S. Novoselov, A. A. Zhukov, and S. Y. Shapoval, *Nature Materials*, 2, 461 (2003)] were proposed as fibrillar adhesives at first. Design parameters for these fibers were proposed as the fiber radius, aspect ratio [C. Greiner, A. del Compo, and E. Arzt, *Langmuir*, 23, 3495 (2007)], tip shape [H. Gao and H. Yao, *PNAS*, 101, 7851 (2004)], and material properties [K. Autumn, C. Majidi, R. E. Groff, A. Dittmore, and R. Fearing, *J. Exp. Biol.*, 209, 3558 (2006)]. Inspired by footpads of various animals in nature such as insects and geckos, spatulated tips on single-level cylindrical [S. Kim and M. Sitti, *Applied Physics Letters*, 89, 261911 (2006)] [N. J. Glassmaker, A. Jagota, C-Y. Hui, & J. Kim, *J. R. Soc. Interface*, 1, 23-33 (2004)], angled [B. Aksak, M. P. Murphy, and M. Sitti, *Langmuir*, 23, 3322 (2007)] and hierarchical [N. J. Glassmaker, A. Jagota, C-Y. Hui, W. L. Noderer, M. K. Chaudhury, *PNAS*, 104, 10786 (2007)][A. del Campo and E. Arzt, *Molecular Bioscience*, 7(2), 118 (2007)] fibers were introduced for developing high performance fibrillar adhesives. In addition, one of the recent findings demonstrates that the real contact perimeter is a more important geometrical factor governing adhesion than the real contact area [M. Varenberg, A. Peressadko, S. Gorb, and E. Arzt, *Applied Physics Letters*, 89, 121905 (2006)]. However, the role of backing layer 32 thickness on adhesion has not been investigated in detail so far.

The backing layer 32 thickness effect on adhesion of elastomeric single-level microfiber structures 30 will now be described. Although a thick backing layer 32 improves the roughness adaptation and fiber 10 contact abilities due to increased effective compliance, this study shows that a thick backing layer 32 could reduce the macroscale adhesion of the fibers 10 on smooth surfaces significantly.

We measured the pull-off force of single-level elastomer fiber array 30 samples with different backing layer 32 thicknesses and developed a theoretical model to explain the observed results. Polyurethane (ST-1060, BJB Enterprise) fiber array 30 samples with spatulated tips 12 are fabricated using the procedure reported in S. Kim and M. Sitti, *Applied Physics Letters*, 89, 261911 (2006). Briefly, we first fabricate negative silicon fiber array templates using deep reactive ion etching as described hereinabove. Liquid polyurethane 70 is filled into these silicon negative templates 50 and cured. The silicon templates 50 are then etched using $XeF_2$, and the fibers 10 are released. The final backing layer 32 thickness of each sample is determined by regulating the gap between the negative template and a glass slide on it.

Figure 7:
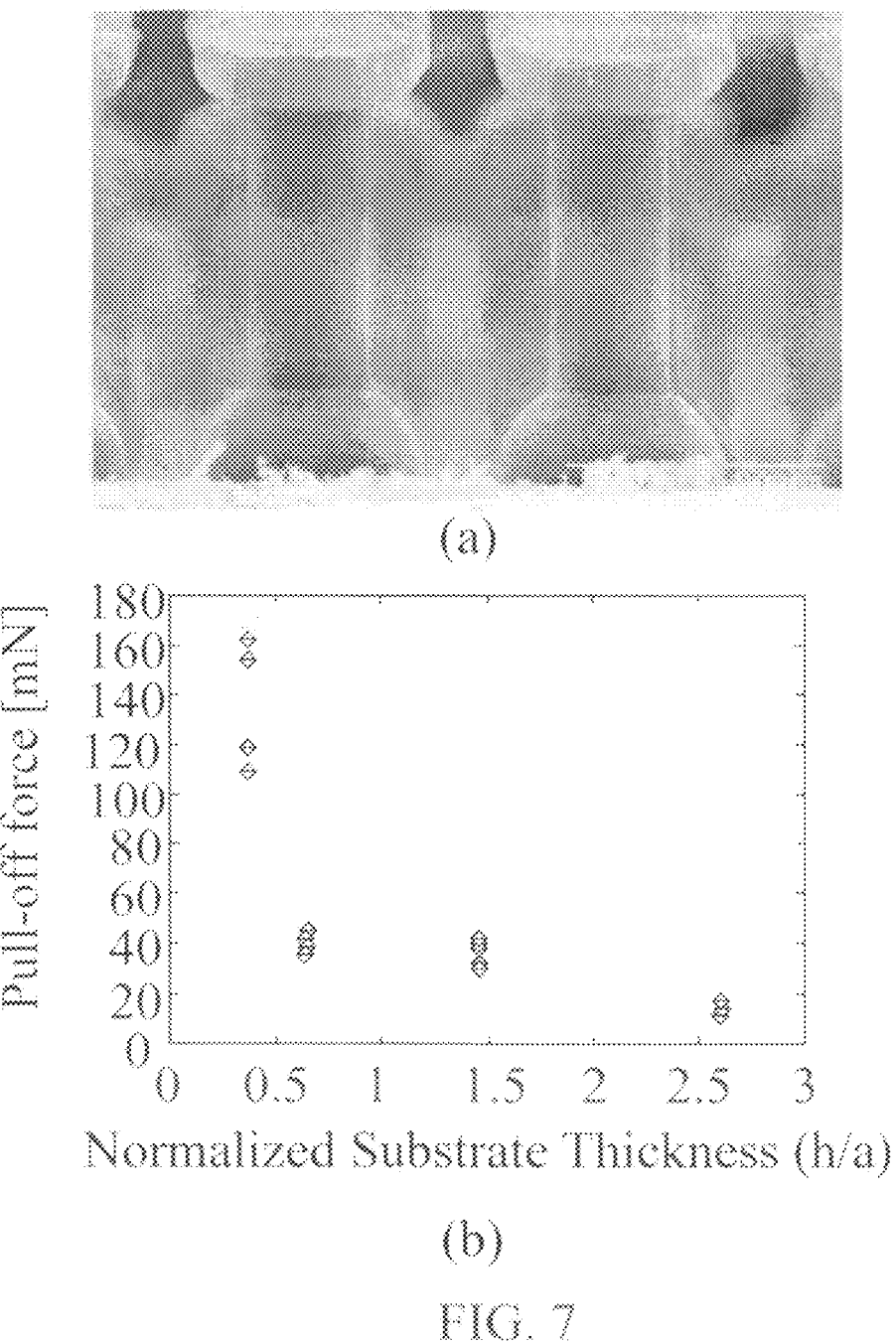
FIG. 7(a) illustrates a scanning electron microscope image of the profile view of a polyurethane elastomer microfiber array with spatulate tips with around 5 µm fiber stem diameter, 9 µm tip diameter, 20 µm length, and 44% fiber density.
FIG. 7(b) illustrates experimental pull-off force (adhesion) ($F_{ad}$) data for elastomer microfiber arrays on a silicon disk with 0.43 mm radius with four different normalized backing layer thicknesses (h/a) for a 10 mN preload (four data points were plotted for each backing thickness on different fiber array locations).

All fiber arrays 30 in our samples have a stem 16 diameter of around five μm and a tip 12 and base 14 support diameter of nine μm. The total length of a fiber 10 is 20 μm and the minimum spacing between fiber centers is 12 μm as displayed in FIG. 7(a). A custom tensile setup was built to measure the adhesion of our samples. Our measure of adhesion in this work is the pull-off load. A silicon disk with 0.43 mm radius and nanometer scale surface roughness was fabricated by patterning a polished silicon (100) wafer using optical lithography and deep reactive ion etching. The silicon disk was attached to a load cell (Transducer Techniques, GSO-25), and moved vertically by a motorized stage (Newport, MFA-CC) with 100 nm resolution. The disk was contacted to and retracted from the fiber array sample with specified preload forces and a slow speed (1 μm/s) to minimize viscoelastic effects. The maximum pull-off force was recorded. In addition, the contact area and the deformation of fiber array 32 during loading and unloading was recorded using a camera (Dage-MT1, DC330) attached to an inverted optical microscope (Nikon, Eclipse TE200).

Adhesion of four samples with 160, 280, 630, and 1120 μm backing layer 32 thicknesses was measured and is shown in FIG. 7(b). Pull-off forces were measured at five different locations on each fiber array 30 for a preload of ten mN. The sample with the thinnest backing layer 32 (160 μm) showed the highest adhesion, with average pull-off force about nine times greater than that of the 1120 μm layer 32.

Figure 8:
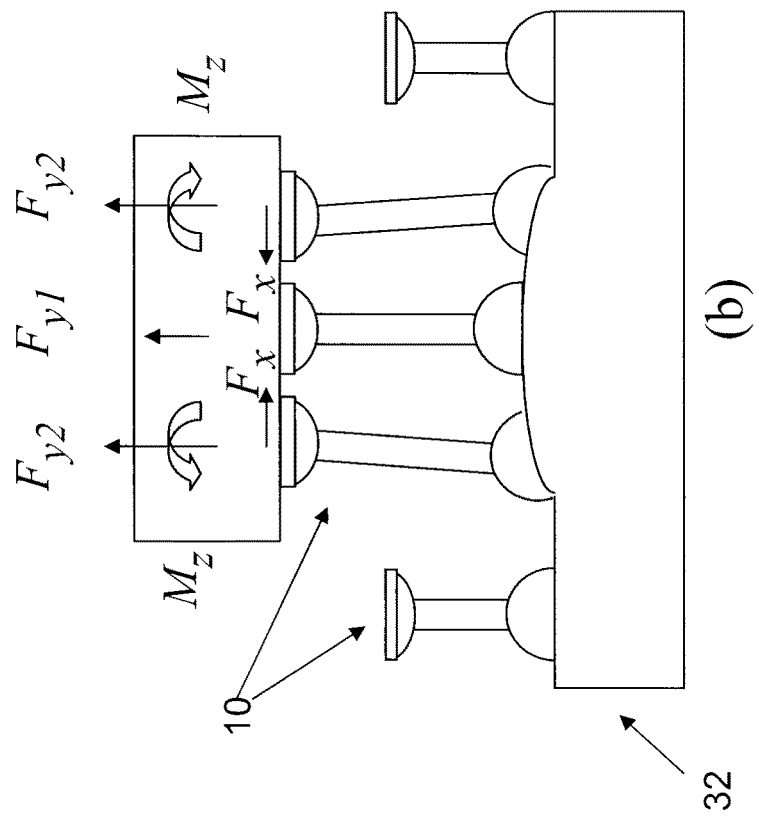
FIG. 8 illustrates schematics of the force analysis in two different backing layer thickness cases under constant displacement: (a) fibers on an infinitesimal thick backing layer; (b) fibers on a very thick backing layer.
Figure 8:
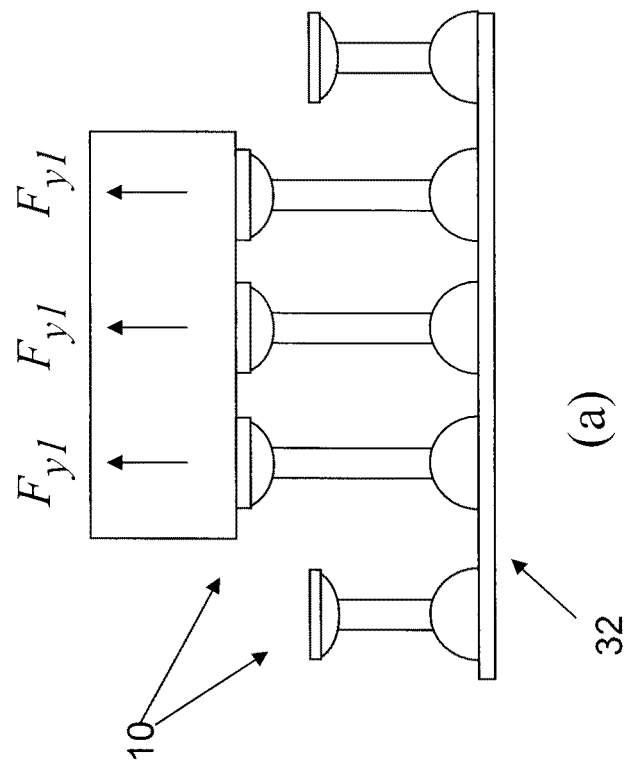

Our interpretation of this surprising finding, that reduced compliance enhances adhesion, lies in the idea that a thinner backing layer 32 promotes equal sharing of the load by the fibers 10. As shown schematically in FIG. 8(a), if a displacement δ were applied to three fibers 10 on an infinitesimally thin backing layer 32, each one would experience the same vertical tension, $F_{y1}$. If the fiber pulled-off at a characteristic force $F_f = k_f \delta_f$ where $k_f$ is the stiffness of the fiber 10 and $\delta_f$ is the fiber 10 elongation at pull-off, then the pull-off force of the system would be $3F_f$. If the thin layer 32 were replaced by a very thick backing 32 (FIG. 8(b)), the y-direction forces would be $F_{y1} = k_f \delta$ and $F_{y2} = k_f \delta + F_B$ where $F_B$ is the additional force required to keep the tip 12 attached to the disk due to non-uniform deformation of the backing layer 32. Because the backing layer 32 is elastic, $F_B = \alpha k_f \delta$ for some positive α. The two fibers 10 on the side will pull-off when $k_f \delta + F_B = F_f$ and the total force at pull-off would be $(3 - \alpha) F_f$.

To quantify this idea for a large number of fibers 10 in contact, we note that the spacing of the fibers 10 are typically very small in comparison with the contact radius a and the thickness of the elastic layer h. Hence, we can treat these fibers 10 as a foundation consisting of elastic springs between the rigid indenter and the backing layer 32. The foundation can support a normal stress σ, which is related to the displacement of foundation, d by σ=kd where k is the stiffness of the foundation. Note that d is the difference in normal displacement between the surface of the indenter and the backing layer 32. The stiffness can be determined by assuming that the fibers 10 are bars with height L and effective cross-sectional area $A_{eff}$, $k=\rho EA_{eff}/L$ where ρ is the number of fibrils per unit area. From the known geometry and stiffness of our fibers, $k=2.37\times10^{-10}$ N/m$^3$ where $\rho=1/(12\times10^{-6})^2$ fibers/m$^2$, E=3 MPa, $A_{eff}=\pi r^2$, r=2.5 μm, and L=14 μm.

The maximum pull-off force occurs in the equal load sharing (ELS) regime, where all the fibers in adhesive contact with the indenter bear the same load. To see how ELS depends on the backing layer thickness and the contact area, assume that all the fibers in contact are in this regime, so at pull-off, we have $$\sigma_f = k\delta_f \quad (3)$$

In the ELS limit, the maximum pull-off force $F_{max}$ is directly proportional to the contact area, $$F_{max} = \pi a^2 \sigma_f \quad (4)$$

where a is the radius of the disk. The ELS limit is strictly valid if the backing layer thickness h is very small compared to a. Another limit is a very thick backing layer with very stiff fibers, that is, when h/a→∞ and α≡ka/2G is very large where G is the shear modulus. In this limit, the interfacial displacement is dominated by the deformation of the elastic layer and the stress distribution is given by the classical solution of a rigid punch in contact with a half space [K. L. Johnson, *Contact Mechanics*, Cambridge University Press (1985)]. The normal stress at the punch edge has a square root singularity characteristic of an opening crack. For α>>1 and h/a>>1, the pull-off force $F_{ad}$ in this limit can be derived as $$F_{ad} = \frac{4F_{max}}{\sqrt{2\pi\alpha}}. \quad (5)$$

This equation shows that, given $F_{max}$, the maximum extent of strength reduction can be predicted. The data in FIG. 7(*b*) show a decrease in pull-off force with increasing thickness. Theoretically, in the limit of very small thickness, pull-off force should asymptotically approach the ELS limit, which depends on the unknown fiber pull off stress, $\sigma_f$. In this limit, the pull-off load is significantly affected by variability in $\sigma_f$. This is reflected in the scatter of the pull-off force data associated with the sample with the smallest h/a.

The theoretical problem of determining pull-off forces as a function of α and h/a is more involved and will be addressed in a future work.

In summary, polyurethane microfiber arrays 30 with spatulated tips 12 on 160 μm thick backing layer 32 show adhesion strength (around 22 N/cm$^2$), nine times greater than fiber arrays 30 with thickness of 1120 μm. A theoretical model is proposed to explain this difference in which very thin backing layers 32 promote equal load sharing, maximizing adhesion. In the other extreme, very thick backings 32 can lead to reduced adhesion, because of edge stress concentration similar to a rigid punch in adhesive contact with a half space. This work shows the significance of backing layer 32 thickness on equal load sharing of single-level microfiber arrays 30 on smooth surfaces.

The present invention describes a method for fabrication of polyurethane elastomer microfiber arrays with flat spatulate tips. For a preload pressure of around 12 N/cm$^2$, adhesion pressures up to 18 N/cm$^2$ and overall work of adhesion up to 11 J/m$^2$ are demonstrated for polyurethane fibers with 4.5 μm fiber diameter, 9 μm tip diameter, 20 μm length, and 44% fiber tip area density on a 6 mm diameter glass hemisphere. These repeatable fibrillar adhesives would have wide range of applications as space, biomedical, sports, etc. adhesives.

Although the present invention has generally been described in general terms and in terms of specific embodiments and implementations, the present invention is applicable to other methods, apparatuses, systems, and technologies. For example, the present invention can be used with a variety of materials, such as metals, ceramics, other polymers, Paralyne, carbon, crystals, liquid crystals, Teflon, semiconductors, piezoelectric materials, conductive polymers, shape memory alloy materials, and organic materials, and these and other materials could be deposited or molded inside the etch layer 40 as described hereinabove. Furthermore, the base 14 of the fibers 10 may not be necessary in some cases, in which case the base may be omitted or it may be considered to be the part of the fiber 10 attached to another structure. The spatulate tip fibers 10 with or without a hydrophobic surface coating can be used as a superhydrophobic surface where the water contact angle could be increased more due to spatulate tip geometry and fiber spacing. During the fiber tip formation (etching), if the etching time is long enough the tip endings could combine and fibers with a continuous flat thin-film can be formed as another type of fiber based adhesives or materials. Different fiber cross-section geometry (square, ellipsoid, triangle, etc.), base geometry (pyramid, etc.), tip diameter, fiber packing geometry (hexagonal or square), high or low aspect ratio, and constant or variable fiber density is possible with the present invention. Although the etch layer removal has generally been described in terms of a dry etch process, it is still possible to use a wet etching method according to the present invention. The spatulate fibers 10 can be used as static friction enhancing materials in addition to enhanced adhesion materials. Micro or nanoscale patterning methods such as interference lithography, electron-beam lithography, nanoimprinting, directed self-assembly, dip pen lithography, laser micro- or nano-machining, micro/nano-milling, and extreme UV lithography can be used to pattern the etch layer for fabricating micro- or nanoscale fibers with spatulate tips.

The examples provided herein are illustrative and not limiting, and other variations and modifications of the present invention are contemplated. Those and other variations and modifications of the present invention are possible and contemplated, and it is intended that the foregoing specification and the following claims cover such modifications and variations.

The invention claimed is:

1. A method of forming a dry adhesive fiber in a structure including an etch layer and a barrier layer, wherein the etch layer and the barrier layer are adjacent to each other and are made from different materials, wherein the etch layer includes a surface of the etch layer opposite the barrier layer, comprising:
    forming an opening through the etch layer to the barrier layer;
    filling the opening with a material;
    removing the barrier layer from the material in the opening; and
    removing the etch layer from the material.

2. The method of claim 1, wherein the step of filling the opening with a material includes filling the opening with a polymer.

3. The method of claim 1, wherein the step of filling the opening with a material includes filling the opening with a material under vacuum.

4. The method of claim 1, wherein the step of removing the etch layer comprises the step of removing the etch layer with a dry etch.

5. The method of claim 1, wherein the material in the opening is selected from the group consisting of liquid polymer and gas phase polymer.

6. The method of claim 1, further comprising the step of expanding the opening in the etch layer adjacent to the surface of the etch layer to form an expanded opening in the surface of the etch layer before the step of filling the opening with the material, wherein the opening in the etch layer extends between the expanded opening in the surface of the etch layer and the barrier layer.

7. The method according to claim 1, further comprising the step of applying a hydrophobic material to a side wall of the opening prior to the step of filling the opening with a material.

8. The method according to claim 1, further comprising the step of forming a fluorocarbon layer to a surface of the barrier layer adjacent to the opening prior to the step of filling the opening with a material, wherein a portion of the fluorocarbon layer is deposited on a flat surface of the material adjacent the surface of the barrier layer to form a dry adhesive fiber tip while removing the etch layer by a dry etch.

9. The method according to claim 1, wherein the barrier layer is silicon oxide.

10. The method according to claim 1, wherein the structure further comprises a substrate attached to the barrier layer, and further comprises the step of removing the substrate from the barrier layer before the step of removing the barrier layer from the material in the opening.

11. The method according to claim 1, wherein the step of forming the opening through the etch layer to the barrier layer further comprises the step of using an electron beam to form the opening.

12. The method according to claim 1, further comprising the step of expanding the opening in the etch layer adjacent to the barrier layer prior to the step of filling the opening with the material.

13. The method of claim 12, wherein expanding the opening in the etch layer adjacent to the barrier layer further comprises the step of removing the etch layer with a dry etch.

14. The method according to claim 1, wherein the step of forming the opening through the etch layer to the barrier layer comprises:
    forming a pattern on the surface of the etch layer to define an exposed etch layer, and
    removing the exposed etch layer.

15. The method according to claim 14, wherein the step of removing the exposed etch layer comprises the step of exposing the structure to an etching process.

16. The method according to claim 15, further comprising the step of removing the pattern after the step of removing the exposed etch layer.

17. A method of forming a dry adhesive fiber array in a first structure including an etch layer and a barrier layer, wherein the etch layer and the barrier layer are adjacent to each other and are made from different materials, wherein the etch layer includes a surface of the etch layer opposite the barrier layer, comprising:
    forming a plurality of openings through the etch layer [[and ]]to the barrier layer;
    filling openings of the plurality of openings with a material;
    removing the barrier layer from the material in the openings of the plurality of openings; and
    removing the etch layer from the material in the openings of the plurality of openings.

18. The method of claim 17, further comprising the step of forming a backing layer is formed from the material used in the openings.

19. The method of claim 17, further comprising the step of expanding the openings of the plurality of openings in the etch layer adjacent to the surface of the etch layer to form expanded openings in the surface of the etch layer before the step of filling the plurality of openings with the material, wherein the openings of the plurality of openings in the etch layer extend between the expanded openings in the surface of the etch layer and the barrier layer.

20. The method according to claim 17, further comprising the steps after the step of filling the openings of the plurality of openings with the material:
    forming a backing layer over the openings of the plurality of
        openings and on the surface of the etch layer opposite the barrier layer, wherein the material in the openings of the plurality of the openings is connected via the backing layer; and
    removing the etch layer from the backing layer.

21. The method according to claim 17, further comprising the step of expanding openings of the plurality of openings in the etch layer adjacent to the barrier layer prior to the step of filling the openings of the plurality of openings with the material.

22. A method of forming a dry adhesive multi-layer fiber arrays with a first structure including a first etch layer and a first barrier layer, wherein the first etch layer and the first barrier layer are adjacent to each other and are made from different materials, wherein the first etch layer includes a first surface of the first etch layer opposite the first barrier layer, and a second structure including a second etch layer and a second barrier layer, wherein the second etch layer and the second barrier layer are adjacent to each other and are made from different materials, wherein the second etch layer includes a second surface of the second etch layer opposite the second barrier layer, comprising the steps of:
    forming a first plurality of openings through the first etch layer to the first barrier layer of the first structure;
    forming a second plurality of openings through the second etch layer to the second barrier layer of the second structure, wherein a cross-section of at least one opening of the second plurality of openings is smaller than a cross-section of the at least one opening of the first plurality of openings;
    connecting the first structure to the second structure such that at least one opening of the second plurality of openings corresponds to at least one opening of the first plurality of openings;
    removing the first barrier layer from the first etch layer; filling the first and second plurality of openings with a material; removing the second barrier layer from the second etch layer; and removing the first and second etch layers surrounding the material in the openings of the first and second plurality of openings to form the dry adhesive multi-layer fiber arrays.

23. The method of claim 22, wherein connecting the first and second structures includes silicon fusion bonding.

24. The method according to claim 22, further comprising the step of forming a backing layer over the first plurality of openings and on the first surface of the first etch layer after the step of filling the first and second plurality of openings with a material, wherein the material in the first plurality of the openings is connected thereto via the backing layer.

25. The method according to claim 22, wherein the step of filling the first and second plurality of openings with the material further comprises the step of filling the first and second plurality of openings with the material to a predetermined level such that none of the material extends out of the openings of the first plurality of openings to form a backing layer.

26. The method of claim 22, further comprising the step of expanding the at least one opening of the second plurality of openings in the second etch layer adjacent to the second surface of the second etch layer to form an expanded second surface opening in the second surface of the second etch layer before the step of connecting the first structure to the second structure, wherein the second plurality of openings in the second etch layer extend between the expanded second surface opening in the second surface of the second etch layer and the second barrier layer.

27. The method according to claim 22, further comprising the step of expanding the at least one opening of the second plurality of openings in the second etch layer adjacent to the second barrier layer to form an expanded second opening prior to the step of connecting the first structure to the second structure.

28. The method according to claim 22, wherein the at least one opening of the first plurality of openings further comprises an end adjacent to the first barrier layer to form a barrier layer end of the at least one opening of the first plurality of openings, and wherein the method further comprises the step of expanding the barrier layer end of the at least one opening of the first plurality of openings.

29. The method according to claim 22, wherein the step of connecting the first structure to the second structure further comprising the step of connecting the first surface of the first etched layer of the first structure directly to the second surface of the second etched layer of the second structure.

30. The method according to claim 22,
further comprising the step of expanding the at least one opening of the first plurality of openings in the first etch layer adjacent to the first surface of the first etch layer to form an expanded first surface opening in the first surface of the first etch layer before the step of connecting the first structure to the second structure;
further comprising the step of expanding the at least one opening of the second plurality of openings in the second etch layer adjacent to the second surface of the second etch layer to form an expanded second surface opening in the second surface of the second etch layer before the step of connecting the first structure to the second structure; and
wherein the step of connecting the first structure to the second structure further comprises connecting the second surface of the second etched layer directly to the first surface of the first structure such that the expanded second surface of the at least one opening of the second plurality of openings in the second etch layer directly corresponds with the expanded first surface opening of the at least one opening of the first plurality of openings in the first etch layer of the first structure.

31. The method of claim 22, further comprising the step of expanding the at least one opening of the second plurality of openings in the second etch layer adjacent to the second barrier layer to form an expanded second barrier layer opening in the at least one opening of the second plurality of opening of the second etch layer before the step of connecting the first structure to the second structure.

32. The method according to claim 22,
further comprising the step of expanding the at least one opening of the first plurality of openings in the first etch layer adjacent to the first surface of the first etch layer to form an expanded first surface opening in the first surface of the first etch layer before the step of connecting the first structure to the second structure;
further comprising the step of expanding the at least one opening of the second plurality of openings in the second etch layer adjacent to the second barrier layer to form an expanded second barrier layer opening in the at least one opening of the second plurality of openings of the second etch layer before the step of connecting the first structure to the second structure; and
wherein the step of connecting the first structure to the second structure further comprises connecting the second surface of the second etched layer directly to the first surface of the first structure such that the at least one opening of the second plurality of openings corresponding to the second surface of the second etch layer is adjacent to the expanded first surface opening of the at least one opening of the first plurality of openings in the first etch layer of the first structure.

33. The method according to claim 22, further comprising the step of removing the first surface from the first etch layer.

34. The method according to claim 22, further comprising the step of removing the second surface from the second etch layer.

35. The method of claim 22, further comprising the step of expanding the at least one opening of the first plurality of openings in the first etch layer adjacent to the first surface of the first etch layer to form an expanded first surface opening in the first surface of the first etch layer before the step of connecting the first structure to the second structure, wherein the at least one opening of the first plurality of openings in the first etch layer extend between the expanded first surface opening in the first surface of the first etch layer and the first barrier layer.

36. The method according to claim 35, wherein the step of connecting the first structure to the second structure further comprises connecting the first surface of the first etched layer directly to the second structure such that the expanded first surface opening is directly adjacent to the at least one opening of the second plurality of openings of the second structure.

37. The method according to claim 22, wherein the at least one opening of the second plurality of openings further comprises an end adjacent to the second surface of the second etch layer to form a second surface end of the at least one opening of the second plurality of openings, and wherein the step of connecting the first structure to the second structure comprises connecting the step of the second surface of the second etched layer directly to the first structure such that the second surface end of the at least one opening of the second plurality of openings directly adjacent to the at least one opening of the first plurality of openings of the first structure.

38. The method according to claim 37, further comprising the step of expanding the second surface end of the at least one opening of the second plurality of openings to form an expanded second surface opening prior to the step of connecting the first structure to the second structure.

* * * * *